United States Patent [19]

Bashark

[11] Patent Number: 4,481,786

[45] Date of Patent: Nov. 13, 1984

[54] ELECTRONIC CONTROL FOR A DOMESTIC APPLIANCE

[75] Inventor: Larry T. Bashark, St. Joseph Township, Berrien County, Mich.

[73] Assignee: Whirlpool Corporation, Benton Harbor, Mich.

[21] Appl. No.: 384,880

[22] Filed: Jun. 4, 1982

[51] Int. Cl.³ .......................................... H07P 1/40
[52] U.S. Cl. ...................... 62/160; 318/438; 34/45; 68/12 R
[58] Field of Search ............... 318/729, 438, 785, 786; 62/160, 158; 60/908; 34/43–45; 68/12 R

[56] References Cited

U.S. PATENT DOCUMENTS

| | | | |
|---|---|---|---|
| 2,625,248 | 1/1953 | Geldhof et al. | 192/116.5 |
| 2,917,175 | 12/1959 | Toma | 210/144 |
| 3,030,790 | 4/1962 | Davenport et al. | 68/13 |
| 3,093,841 | 6/1963 | Cobb et al. | 8/158 |
| 3,359,766 | 12/1967 | Haas | 68/207 |
| 3,497,884 | 3/1970 | Tichy et al. | 8/158 |
| 3,508,287 | 4/1970 | Mason | 8/158 |
| 3,600,657 | 8/1971 | Pfaff | 318/218 |
| 3,777,232 | 12/1973 | Woods et al. | 318/786 |
| 3,811,093 | 5/1974 | DeLeo | 329/146 |
| 3,846,688 | 11/1974 | Perloff | 318/490 |
| 3,882,364 | 5/1975 | Wright et al. | 318/786 |
| 3,953,794 | 4/1976 | Moore | 324/83 |
| 4,047,082 | 9/1977 | Scheaur et al. | 318/782 |
| 4,052,648 | 10/1977 | Nola | 318/200 |
| 4,057,228 | 11/1977 | Völker et al. | 366/79 |
| 4,063,112 | 12/1977 | Dumbeck | 307/116 |
| 4,194,129 | 3/1980 | Dumbeck | 307/149 |
| 4,201,240 | 5/1980 | Case | 137/392 |
| 4,218,899 | 8/1980 | Mason | 68/12 |
| 4,297,628 | 10/1981 | Hedges | 318/778 |
| 4,298,834 | 11/1981 | Opfer | 318/729 |
| 4,355,274 | 10/1982 | Bourbeau | 318/729 |
| 4,399,394 | 8/1983 | Ballman | 318/786 |
| 4,401,933 | 8/1983 | Davy et al. | 318/786 |

Primary Examiner—E. A. Goldberg
Assistant Examiner—Art Evans
Attorney, Agent, or Firm—Hill, Van Santen, Steadman & Simpson

[57] ABSTRACT

An automatic control for various domestic appliances has a ferrite core which surrounds the run winding for the drive motor of the appliance. The run winding represents the primary winding for the ferrite core, which has a secondary winding at which a brief output voltage is generated whenever the run winding current changes direction. This sensor in combination with a voltage zero detector circuit and post-connected logic circuitry generates a voltage pulse and a phase pulse which are respectively related to the voltage level of the drive motor and the motor output torque which is required to operate a movable member in the appliance. A microcomputer is utilized to generate a representative digital phase number which corresponds to the torque expended in the appliance. The phase number is utilized in various programs of the microcomputer for automatically controlling various functions of the appliance as well as other events in an operational sequence upon the attainment of selected torque levels.

79 Claims, 31 Drawing Figures

ELECTRONIC CONTROL FOR A DOMESTIC APPLIANCE

BACKGROUND OF THE INVENTION

1. Field of the Invention

The invention relates to domestic appliances which commonly use at least one AC induction drive motor such as clothes washers, dishwashers, clothes dryers, trash compactors, food refrigerators, heat pumps and air conditioners. In particular the invention relates to (1) a motor phase monitoring circuit means for generating one independent motor phase sample during each line voltage half cycle and (2) appropriate appliance microcomputer program routines which use the above phase samples to infer motor output torque for the purpose of controlling operation of the appliance.

2. Description of the Prior Art

A power factor control system for AC induction motors is disclosed in U.S. Pat. No. 4,052,648 which samples line voltage and current through the motor and decreases power input to the motor in proportion to the detected phase displacement between current and voltage thereby providing less power to the motor when the motor is lightly loaded.

An electronic method and apparatus for monitoring motor torque is disclosed in U.S. Pat. No. 3,600,657 which employs a current sensitive pickup device in combination with a zero crossing detector and a pulse generator circuit for producing an analog signal which is proportional to the motor torque and which is employed to control a relay to start and stop the motor.

A circuit for monitoring the mechanical power from an induction motor and for detecting excessive heat exchanger icing is disclosed in U.S. Pat. No. 4,123,792 wherein a circuit is used in conjunction with a small resistor wired in series with the outdoor evaporator fan motor of a heat pump to develop a signal corresponding to $I\cos\theta$ which is substantially proportional to the mechanical output of the motor. The signal is averaged for a period of several seconds by an RC integrating circuit and the averaged signal is compared to a reference load set point which must be individually adjusted for each fan motor during installation of each heat exchanger.

The present electromechanical pressure switches used for clothes washer water-level control permit user selection and control of the water fill by adjusting a control knob or lever switch which is connected by mechanical linkage to an eccentric cam which prebiases the diaphragm of the pressure switch mechanism. The present system affords the possibility of considerable operator error either by wasting hot water or by allowing all drive train components to be damaged by torque overloads due to insufficient water in the wash bath. Abrasion damage to clothes items can also result from insufficient water in the wash bath. Control systems which eliminate this problem by not allowing direct user selection or control of the water level and by instead controlling the water fill in response to some machine condition are called automatic water level controls.

Prior art clothes washer automatic water level controls are disclosed in U.S. Pat. Nos. 3,030,790; 3,359,766; 3,478,373; 3,497,884 and 3,508,287, these controls respond respectively, to torque transmitted through the wash bath from the agitator to the spin basket, wash load torque manifested as fluid pressure in a hydrostatic transmission, water flow due to clothes rollover in the wash bath, restraining torque exerted on the agitator and motion of the spin basket relative to the tub due to agitator action.

An electronic liquid level monitoring system which provides a quantitative analog-type measurement of water level in a digital format is disclosed in U.S. Pat. No. 4,201,240. A mechanical device oscillates within a coil to provide signals which are counted and a calculated multiple of the count is compared with an electronically stored table corresponding to predetermined liquid levels and the results of the comparison is utilized to initiate control functions for operating the washing machine by means of a microcomputer.

Prior art dishwasher water fill volume has generally been controlled by electrical actuation of the solenoid of a fill valve for a fixed time period, typically 120 seconds, and metering the water inlet flow rate with a flow washer having one or more orifices that are size responsive to the installation water pressure. Overflow failures are prevented by a separate float switch wired in series with the fill valve solenoid. A preset factory calibrated dishwasher fill volume must assume simultaneous worst case conditions of fast pump, full dish loading, high sudsing detergent and high line voltage to guarantee that all units will always operate with sufficient water to avoid pump starvation. This often results in some wasted hot water when any or all of the above worst case conditions are not present. Dishwasher controls which automatically terminate the water fill as soon as sufficient water is present in the dishwashing system to allow smooth water pumping at a maximum flow rate with no water starvation under a wide variety of operating conditions are called automatic water level controls.

A dishwasher automatic water level control is disclosed in U.S. Pat. No. 3,415,261 wherein a pressure responsive switch in the lower sump area is used to detect when sufficient water is present in the dishwashing system to achieve a full pumping water pressure and terminate the water fill. Elevated air holes at the pump water inlet area result in the pump drawing partly air and cavitating until the sump water reaches the proper fill height.

A microprocessor based control circuit for washing appliances such as dishwashers and clothes washers is disclosed in U.S. Pat. No. 4,241,400 wherein a drain feedback switch is mechanically linked to a hinged diverter valve in the pump water flow path to detect when substantially all of the water has been discharged into the drain line. The electrical state of the drain feedback switch is input to the microprocessor to save or reallocate machine cycle time and facilitate detection of various drain fault conditions such as the failure to drain, slow drain or a plugged drain.

U.S. Pat. No. 3,777,232 discloses a circuit wherein the start winding of a motor is removed from the circuit on the basis of a phase difference between the main winding current and the applied voltage.

SUMMARY OF THE INVENTION

It is an object of the present invention to provide a motor phase monitoring circuit which provides one independent motor phase sample pulse output during each line voltage half cycle for use with an electronic control circuit on domestic appliances which use at least one AC induction drive motor.

It is another object of the present invention to utilize an appliance microcomputer with precise crystal controlled clock timing cycles in conjunction with the phase monitoring circuit to convert the analog pulse width of each phase sample pulse output to a phase or phase angle number which can be temporarily stored in a microcomputer memory register and which provides sufficient resolution for use in comprehensive microcomputer program routines to provide improved appliance control.

It is a further object of the present invention to provide various combinations of monitor circuit hardware adjustments and/or microcomputer software modifications which can be made to facilitate the generation of phase numbers which correspond to the true motor phase angle $\theta_t$, a partially line voltage compensated motor phase angle $\theta_p$, or a fully line voltage compensated motor phase angle $\theta_f$ as best suits each individual appliance application thereby compensating for the effects of installation line voltage and line voltage fluctuation.

A further object of the present invention is to utilize the known relationship which exists between an AC induction motor mechanical output torque and the corresponding main winding phase angle by monitoring an independent sample of the motor main winding phase angle during each line voltage half cycle to infer the corresponding magnitude of the motor mechanical output torque. The relationship between AC induction motor torque and phase angle is inverse; i.e., a large phase angle or wide phase sample pulse output of the motor phase monitoring sensor circuit corresponds to a lightly loaded motor, and a small phase angle or narrow phase sample pulse corresponds to a heavily loaded motor. Thus, high phase numbers correspond to low motor output torque, and low phase numbers correspond to high motor output torque.

A further object of the present invention is to use microcomputer memory registers and appropriate programming techniques to provide automatic referencing of each unit for possible unit variations in absolute motor operating phase angle to eliminate the need for individual unit calibration either as a part of the manufacturing process or the appliance installation procedure.

A further object of the present invention is to provide microcomputer phase number processing techniques which provide automatic compensation for possible line voltage asymmetry between odd and even half cycles.

A further object of the present invention is to provide a motor start control with a microcomputer routine which uses the motor main winding phase numbers and an automatic referencing technique based on two consecutive low RPM motor phase numbers obtained at the start of the routine to determine when a capacitor-start or split-phase AC induction motor has started.

A further object of the present invention is to provide a motor stall detection circuit to promptly remove power from a stalled motor with a microcomputer routine which uses the motor main winding phase numbers to determine when an AC induction motor has stalled by accumulating the total number of consecutive-odd and consecutive-even half cycle phase numbers which are equal in a microcomputer data register for a preset number of half cycles and comparing the total to a stalled motor threshold. This routine is usually included as a subroutine in all other task oriented routines.

A further object of the present invention is to provide a vertical-axis clothes washer automatic water level control with a microcomputer routine which computes the difference between the maximum and minimum sum of two consecutive motor phase numbers for the known number of half cycles required for the agitator to complete one stroke and a supervisory microcomputer routine which calls the above routine and sums the above difference numbers for a preset number of consecutive agitator strokes and compares the sum to a threshold number based on a user cycle selection, water temperature selection and fill-type (wash fill or rinse fill) for the purpose of determining when to terminate the water fill.

A further object of the present invention is to provide a basic microcomputer motor torque averaging routine which uses consecutive line voltage compensated motor main winding phase numbers to compute an average motor torque number with a controlled averaging period ranging from a fraction of a second to more than ten minutes.

A further object of the present invention is to provide a group of supervisory routines which call the basic motor torque averaging routine to provide a clothes washer end-of-drain control, a clothes dryer dryness control, a dishwasher automatic water level control, a dishwasher end-of-drain control and a heat pump demand defrost control.

A further object of the present invention is to provide a basic motor phase variability routine which accumulates a motor phase variability number over a fixed period of half cycles by using the microcomputer to sum blocks of consecutive phase numbers, subtract the most recent block sum from the third most recent block sum and accumulate the absolute value of the difference for a plurality of consecutive block comparisons. When the above routine is used with a dishwasher the resulting motor phase variability numbers may be referred to as pump slugging numbers and are a measure of how smooth the pump is running.

A further object of the present invention is to provide dishwasher supervisory routines which call the basic motor phase variability routine to provide a preferred dishwasher automatic water level control and a preferred dishwasher end-of-drain control.

A further object of the present invention is to provide a modified motor phase variability routine for a clothes dryer which accumulates a motor phase variability number over a fixed period of half cycles by using the microcomputer to sum blocks of consecutive phase numbers, subtract the most recent block sum from the fifth most recent block sum and accumulate the absolute value of the difference for a plurality of consecutive block comparisons. When the above routine is used with a clothes dryer the resulting motor phase variability numbers may be referred to as clothes tumble numbers. Subtracting the most recent block sum from the fifth most recent block sum provides a measure of the variation in motor torque due to differences in the clothes tumble pattern from one drum revolution to the very next drum revolution while minimizing the effects of positional variations in drum friction. When a supervisory routine which calls the above motor variability routine has determined that the clothes tumble numbers are no longer decreasing, a clothes cycle termination procedure begins.

A further object of the present invention is to provide a modified motor phase variability routine for a horizontal-axis clothes washer which generates a clothes tumble number over a fixed period of half cycles by using the microcomputer to sum blocks of consecutive phase numbers, subtract the most recent block sum from the fifth most recent block sum and accumulate the absolute value of the difference for a plurality of consecutive block comparisons. Subtracting the most recent block sum from the fifth most recent block sum provides a measure of the variation in motor torque due to differences in the clothes tumble pattern from one drum revolution to the very next drum revolution while minimizing the effects of positional variations in drum friction. A supervisory routine which calls the modified motor phase variability routine a plurality of times during each wash or rinse water fill achieves automatic water level control by terminating the fill when the clothes tumble numbers have exceeded a level determined by an automatic referencing procedure at the beginning of the fill.

DESCRIPTION OF THE PREFERRED EMBODIMENT

The phase angle of any major home appliance single phase fractional horse power induction motor is inversely related to the mechanical load on the motor. This relationship is utilized in the present invention by a circuit which provides a voltage compensated phase pulse and a voltage pulse as inputs to an appliance microcomputer to monitor and process an independent sample of the motor main winding phase angle during each line voltage half cycle. Flowcharts for portions of the programmed microcomputer are disclosed which show how the microcomputer may be dedicated during the first portion of each half cycle to perform an analog-to-digital conversion of the pulse width of the phase and voltage pulses using internal crystal controlled clock cycles to generate a phase number proportional to (1) the voltage compensated phase pulse or (2) the true motor phase angle. Additional flow charts for the programmed microcomputer are disclosed which show how the microcomputer processes each phase sample after completion of each phase pulse to achieve a desired goal such as starting a motor without a centrifugal switch or current relay, detecting when a motor has stalled, providing clothes washer or dishwasher automatic water level control or automatic drain termination, providing improved dryer clothes dryness detection, and providing heat pump demand defrost.

Figure 1:
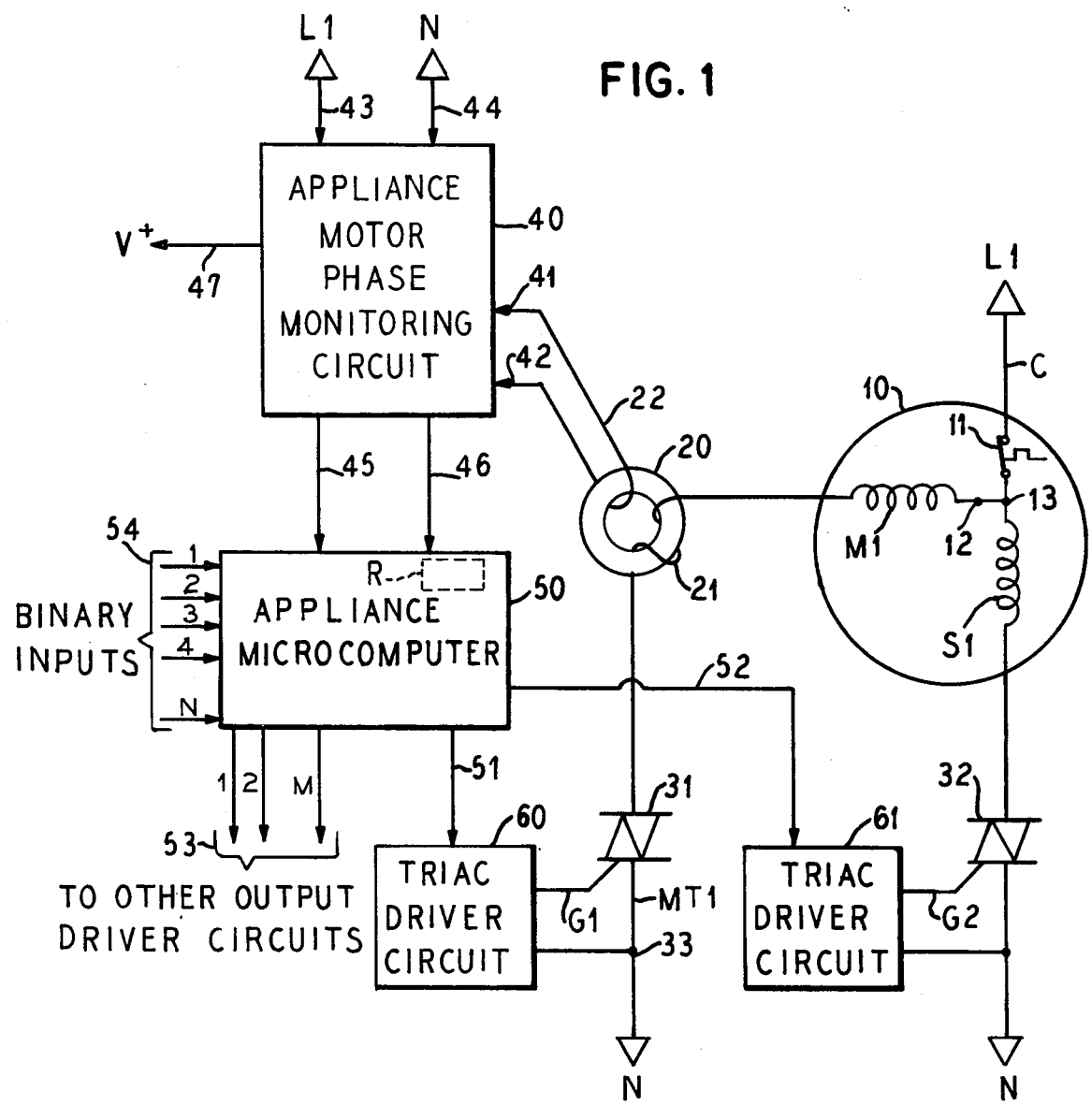
FIG. 1 is a schematic circuit showing a generalized appliance control with an AC induction motor, phase monitoring circuit, appliance microcomputer, microcomputer inputs and outputs, TRIACs and TRIAC driver circuits.

As shown in FIG. 1, a motor 10 has a thermal overload protector 11, at least one main winding M1 and at least one start winding S1. The main winding M1 is connected in series with a main winding TRIAC 31 through a two-turn primary winding 21 on a small core 20. The start winding S1 is connected in series with a start winding TRIAC 32. An alternating source of power, such as 120 VAC, 60 Hertz is provided having electrical leads or sides N and L1. Both TRIACs 31 and 32 are connected to the neutral side N of the AC power source. A motor common electrical lead C completes a current path for both the main winding M1 and the start winding S1 to the L1 side of the power source through the overload protector 11. A single-turn sense winding 22 on the core 20 is connected to an appliance motor phase monitoring circuit 40 by electrical leads 41 and 42. Power is also provided from the AC source as a signal input to the phase monitoring circuit 40 by electrical leads 43 and 44. The phase monitoring circuit 40 provides a voltage compensated phase pulse $\theta_N$ and a voltage pulse $V_N$ which are respectively connected by electrical lines 45 and 46 as binary inputs to an appliance microcomputer 50. Front-end circuitry in the phase monitoring circuit 40 is used to generate a regulated source of DC voltage V+ on electrical line 47 appropriate for the microcomputer 50 and other electronics. One binary output 51 of the microcomputer 50 is used to control a first TRIAC driver circuit 60 to provide a control signal which is applied to the gate lead G1 of the main winding TRIAC 31. Similarly, a second binary output 52 of the microcomputer 50 is used to control a second TRIAC driver circuit 61 to provide a control signal to the gate lead G2 of the start winding TRIAC 32.

An additional start winding may be used on some products to provide bi-directional operation of the motor 10. If the first start winding is used to start the motor in a clockwise direction, then the second start winding is used to start the motor in a counterclockwise direction. In some applications an increase in motor 10 starting torque may be obtained by connecting a start capacitor between the start winding S1 and the start winding TRIAC 32, or, improved start winding protection may be obtained by connecting a positive temperature coefficient resistor in series with the start winding S1. One or more main or run windings may be used on some products to provide a second motor speed. Each additional motor winding would require a separate control TRIAC, TRIAC driver circuit and microcomputer 50 binary output line. Only one main winding TRIAC is activated at any one time. When a motor with more than one main winding is used, either each main winding must be connected in series with a separate two-turn primary winding on the core 20, or preferably, the first main terminal MT1 of each main winding TRIAC should be connected to point 33, and a single two-turn primary winding 21 of the core 20 should be connected between point 33 and the neutral side N of the AC power source. The latter approach requires only a single two-turn primary winding 21 on the core 20. Alternately, the core 20 may be included in the motor 10 assembly by connecting each motor main winding to a common point 12 and connecting the single two-turn primary winding 21 between points 12 and 13. Start winding current must not be included as a component of the two turn primary winding 21 of the core 20 if the control is to be used to start the motor without a centrifugal switch or a current relay.

The required number of additional microcomputer 50 binary output lines 53 varies with each appliance product to which the circuit is applied. Binary outputs 53 may be required to provide control signals for additional motor windings, heater elements (clothes dryer heater, refrigerator defrost heater, dishwasher heater), solenoids (clothes washer hot and cold water solenoids, spin solenoid, agitate solenoid, bleach dispenser solenoid, dishwasher hot water solenoid), thermal actuators (dishwasher detergent dispensers), control panel lights and displays. Each binary output line is connected to an individual TRIAC or transistor driver circuit and a separate TRIAC or transistor control element. The TRIAC driver circuits may include a pulse transformer or a photon coupled isolator to maintain electrical isolation of the microcomputer 50 and phase monitoring circuit 40 from the line voltage. It will be apparent to those skilled in the art that some or all of the TRIACs and TRIAC driver circuits may be replaced by relays and relay driver circuits.

The required number of microcomputer 50 binary input lines 54 varies with each appliance product to which the circuit is applied. Some binary inputs 54 may be derived from console cycle selection buttons such as clothes washer or dryer NORMAL, PERMANENT PRESS or DELICATE cycles. Other binary inputs 54 may derive from dishwasher detergent cup lid switches, a dishwasher overfill switch, clothes washer minimum and maximum water level pressure switches, clothes dryer operating and safety bimetal switches, refrigeration thermostats and product lid or door switches. It will be apparent to those skilled in the art that the microcomputer 50 may be interfaced with the outside world through the use of a peripheral interface adapter integrated circuit to facilitate use of a large number of inputs and outputs with a small number of actual microcomputer 50 input/output lines. It will also be apparent to those skilled in the art that a large number of TRIAC and other driver circuits and microcomputer input/output interfacing techniques are fully appropriate for use in accordance with the present invention.

Figure 2:
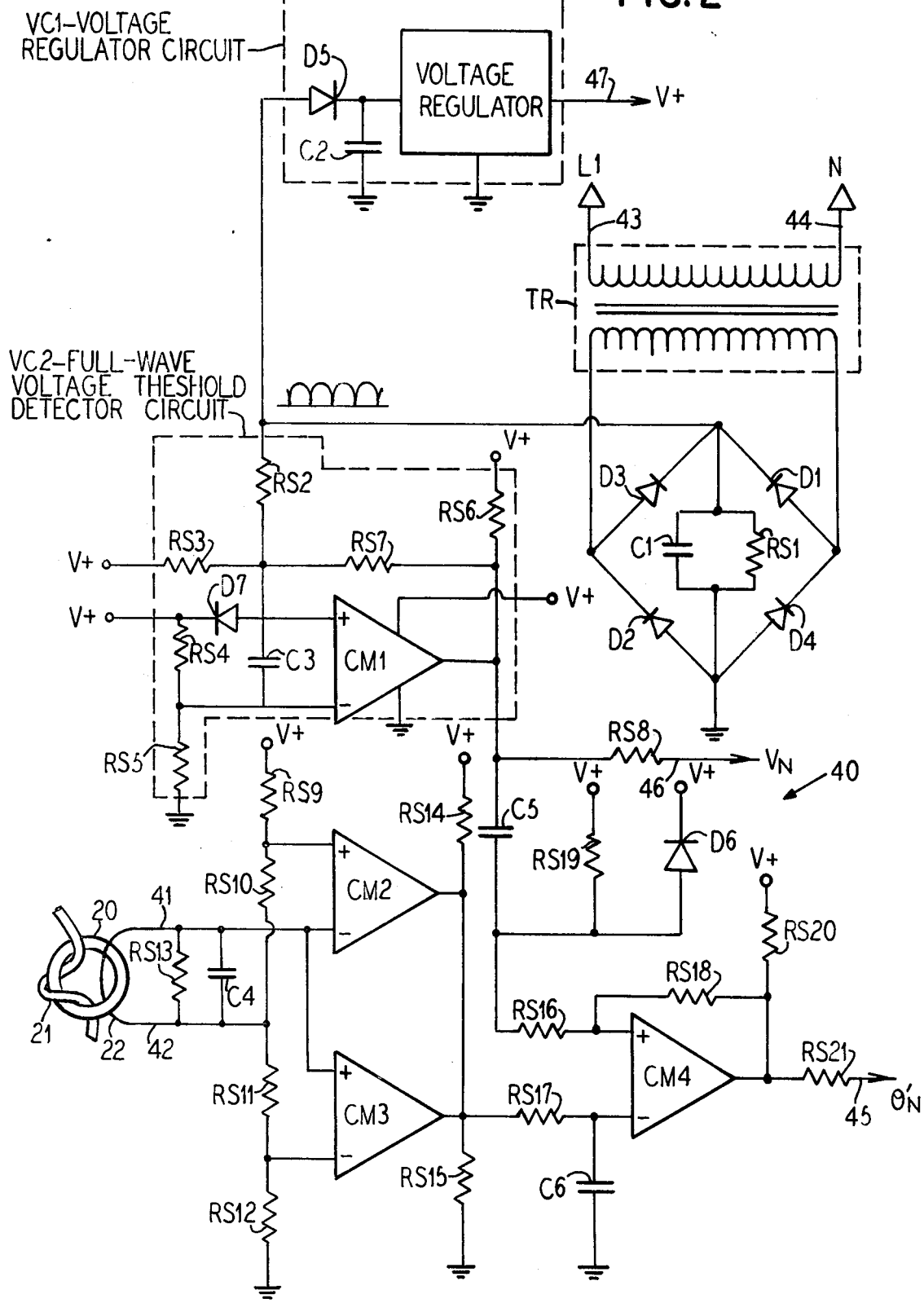
FIG. 2 is a circuit diagram for the phase monitoring circuit of FIG. 1.

The appliance phase monitoring circuit 40 is shown in FIG. 2. A step down transformer TR is employed in combination with a diode bridge consisting of a resistor RS1, a capacitor C1 and diodes D1, D2, D3 and D4 to develop a 120 Hz full-wave rectified waveform as shown by the waveform V in graph 3A of FIG. 3. The resistor RS1 provides sufficient diode bridge loading to forward bias appropriate diode pairs when an isolation diode D5 is reverse biased. High frequency noise transduced from the primary to the secondary of transformer TR is filtered by bypass capacitor C1. The full-wave rectified voltage is supplied to a voltage regulator circuit VC1 and to a full-wave voltage threshold detector circuit VC2. The voltage regulator circuit consists of isolation diode D5, a filter capacitor C2 and a voltage regulator in the form of an integrated circuit. The integrated circuit voltage regulator is selected to have a regulated DC voltage output V+ which is compatible with the microcomputer 50. Diode D5 is reverse biased throughout the period immediately before, during and after each line voltage zero crossing, thus allowing a comparator CM1 to be used to detect a voltage threshold near the full-wave rectified voltage zero value without being affected by the DC voltage maintained across filter capacitor C1. The voltage regulator current drain through diode D5 occurs during the peak full-wave rectified voltage of each half cycle and has no effect on the generation of a narrow voltage pulse by comparator CM1. The appliance phase monitoring circuit is capable of operating over a wide range of DC voltages and uses the same V+ required by the microcomputer 50 for the appliance to which the circuit is applied. In the exemplary embodiment shown in FIG. 2, V+ is 12 volts, and the peak-to-ground full-wave rectified voltage signal is 26 volts at an input voltage of 120 VAC. The voltage pulse width is 860 microseconds when the line voltage is 120 VAC, 60 Hertz.

The full-wave voltage threshold detector circuit is utilized to produce a voltage pulse having a width which is inversely related to the AC line voltage, as shown in graph 3B of FIG. 3. The voltage threshold detector circuit comprises resistors RS2, RS3, RS4, RS5, RS6 and RS7, a capacitor C3, a diode D7 and comparator CM1 which is supplied with V+ from the voltage regulator circuit. The threshold of the comparator CM1 is selected at a sufficiently low value to provide a narrow voltage pulse which is triggered as the full-wave rectified voltage waveform approaches zero to produce a voltage pulse leading edge. The threshold is determined by the voltage applied to the inverting input of comparator CM1 by the series resistor divider network RS4 and RS5. Capacitor C3 filters any remaining high frequency noise across the inputs of comparator CM1. Diode D7 limits the maximum input voltage to the non-inverting input of comparator CM1. The voltage pulse leading edge will thus slightly precede the true line voltage zero voltage crossover. The trailing edge of the comparator CM1 output pulse occurs at substantially the same threshold level on the opposite side of the true line voltage zero crossover on the rising edge of the next voltage waveform so as to produce a voltage pulse trailing edge which slightly follows the true voltage zero crossover. As shown in graph 3B of FIG. 3, the width of the pulses generally designated $V_N$ may vary according to the amplitude of the full-wave rectified waveform, which determines the steepness or slope of the waveform in the vicinity of the zero value. If the waveform V is assumed to be an average or mean waveform which produces the pulses shown in solid lines, a waveform $V_a$ having a larger amplitude than the waveform V will generate a narrower pulse $V_{1a}$, shown in broken lines in graph 3B, and a waveform $V_b$ having a smaller amplitude than the waveform V will produce a wider pulse $V_{3b}$, also shown in broken lines in graph 3B. Three successive voltage pulses designated $V_1$, $V_2$ and $V_3$ are shown in graph 3B in relation to the full-wave rectified waveform V. A series of these voltage pulses, generally designated $V_N$ in FIG. 2, is supplied to the microcomputer 50 by input/output line 46 from comparator CM1 through a resistor RS8 and is capacitor coupled to the non-inverting input of another comparator CM4 by a capacitor C5 and a resistor RS16.

The core 20 is responsive to polarity changes with zero crossings of the appliance motor main winding current I as previously explained. The core 20 of the exemplary embodiment has a two-turn primary winding 21 which is connected in series with the motor main winding M1 and a single-turn secondary or sense winding 22 which may be wound in either a clockwise or counterclockwise direction about the core 20. All of the magnetic flux in the small core 20 changes direction shortly after the motor main winding current I changes polarity. The brief voltage spikes S generated in sense winding 22 upon each polarity change of the main run winding current I are shown in graph 3C of FIG. 3. In accordance with Faraday's Law of voltage induction, the electromotive force which is generated across sense winding 22 is proportional to the rate of change of the magnetic flux of the core 20. The core 20 quickly saturates immediately following each main winding M1 current zero crossing. Thus, alternating positive and negative voltage spikes S are generated during each half cycle. The core 20 thus operates as a small, continuous, quickly saturating nonlinear device which directly responds to the AC primary current zero crossings with a sequence of alternating positive and negative voltage spikes S. Sensor core primary winding 21 and sense winding 22 lead wires must be threaded through the central core opening. The core 20 for this purpose must be continuous with no cut air gap or mechanism clamp hinges. A preferred low cost core 20 is a ferrite bead Part Number 2643002402 manufactured by Fair-Rite Products Corporation. As an alternative, small tape wound cores having a metal alloy with a high nickel content that provide a larger sense winding voltage signal with less coupled power line conducted radio frequency interference may be used, but the cost is greater.

A resistor divider network comprised of resistors RS9, RS10, RS11 and RS12 is connected to sense winding 22 through conductors 41 and 42 and is employed to bias a pair of comparators CM2 and CM3 to the HIGH state when the voltage output of the sense winding 22 is zero. A further resistor RS13 and a capacitor C4 are connected across the sense winding 22. Capacitor C4 suppresses a high frequency voltage transient which may be induced in the sense winding 22 as a result of any conducted or airborne radio frequency noise pickup. Resistor RS13 provides a conductivity path which forces the output of comparators CM2 and CM3 to the HIGH state in the unlikely event that conductor 41 or 42 becomes an open circuit. The HIGH state output voltage of comparators CM2 and CM3 is determined by a resistor divider network comprised of resistors RS14 and RS15.

Lead 42 of the sense winding 22 from the core 20 is connected between the resistors RS10 and RS11. This point in the circuit is always at substantially one half of the value of V+ and thus guarantees that the comparator inputs will not be operating near ground or near the positive voltage supply. The comparator CM2 is connected to respond to positive voltage spikes S. Lead 41 of the sense winding 22 is connected to the inverting input of a comparator CM2 so that positive spikes S supplied to this input overcome the bias voltage drop across the resistor RS10, thus causing the voltage at the inverting input of CM2 to go LOW. Thus, the output voltage of comparator CM2 is near circuit ground for the duration of the positive spike S. Similarly, the comparator CM3 responds to negative spikes S generated by the core 20. Lead 41 is also connected to the non-inverting input of comparator CM3. The negative spikes overcome the normal positive bias established by the voltage drop across the resistor RS11 at the non-inverting input of CM3 with respect to the inverting input of CM3. The negative spikes cause the output of comparator CM3 to go LOW for the duration of the negative spike S. The outputs of the respective comparators CM2 and CM3 constitute a wired OR connection inasmuch as either comparator is capable of producing the low output shown in graph 3D of FIG. 3. As shown in graph 3D, the pulse $I_1$ is generated at the output of the comparator CM2, the pulse $I_2$ is generated at the output of comparator CM3, and the pulse $I_3$ is again generated at the output of CM2. The comparator outputs thus form a series of pulses which produce an input to a resistor RS17.

The operation of comparator CM4 is in the manner of a SET/RESET flip flop. Comparator CM4 is SET when the output is LOW or near ground and RESET when the output is HIGH or near V+. The SET input is provided by the leading edge of each voltage pulse which is capacitor coupled by capacitor C5 to the non-inverting input of comparator CM4 through resistor RS16. Capacitor coupled edge detection is used to provide for the possibility that the RESET pulse may occur before the completion of the voltage pulse. The RESET input is provided by the wired OR outputs of comparators CM2 and CM3 to the inverting input of comparator CM4 through resistor RS17. A filter capacitor C6 at the inverting input of comparator CM4 is used to prevent any noise pulse of less than about 2 microseconds duration which may emanate from the core 20 or the lead wires 41 and 42 from falsely resetting the output state of comparator CM4. Resistor RS18 provides feedback from the output to the non-inverting input of comparator CM4 to maintain a SET or RESET state of the output of CM4. Resistor RS20 is a load resistor connected to the output of comparator CM4. Resistor RS19 is connected to the supply voltage V+ and is part of a series resistor divider network comprising resistors RS16, RS18 and RS19 which is necessary to establish a stable voltage at the non-inverting input of comparator CM4 when the output of CM4 is SET (LOW). Resistor RS15 is part of a series resistor divider network comprising resistors RS14 and RS15 which establishes a stable voltage of less than V+ but greater than the voltage established by RS16, RS18 and RS19 at the non-inverting input of comparator CM4 when the output of CM4 is SET. Diode D6 is used to clamp the voltage at the point between capacitor C5 and resistor RS16 to the supply voltage V+ to avoid the possibility of falsely resetting the output of comparator CM4 at the trailing edge of a voltage pulse.

The output of the comparator CM4 is supplied to the micrcomputer 50 by input/output line 45 through a resistor RS21 as a voltage compensated phase or phase angle pulse $\theta_N$. A series of such pulses identified as $\theta_1$, $\theta_2$ and $\theta_3$ are shown in graph 3E of FIG. 3. Although the values of the components shown in FIG. 2 may be selected to meet individual circuit requirements in a manner known to those skilled in the art without departing from the inventive concept disclosed herein, an exemplary embodiment of the circuit of FIG. 2 can be realized wherein the comparators CM1, CM2, CM3 and CM4 are each one-quarter of an LM339 quadruple comparator package and wherein the remaining components have the following values:

| COMPONENT | VALUE (OHMS) |
| --- | --- |
| RS1 | 4.7k |
| RS2 | 10k |
| RS3 | 100k |
| RS4 | 100k |
| RS5 | 47k |
| RS6 | 5.1k |
| RS7 | 1M |
| RS8 | 18k |
| RS9 | 33k |
| RS10 | 100 |
| RS11 | 100 |
| RS12 | 33k |
| RS13 | 100 |
| RS14 | 5.1k |
| RS15 | 10k |
| RS16 | 30k |
| RS17 | 20k |
| RS18 | 30k |
| RS19 | 30k |
| RS20 | 5.1k |
| RS21 | 18k |
| C1 | .02uf |
| C2 | 1500uf |
| C3 | 100pf |
| C4 | .15uf |
| C5 | .001uf |
| C6 | 220pf |

The microcomputer 50 receives the voltage pulse $V_N$ and the voltage compensated phase pulse $\theta_N$ inputs at a pulse rate of two times the frequency of source of AC power. For a 60 Hertz AC power frequency the rate is 120 pulses per second. The voltage pulse train $V_N$ is present regardless of whether the motor 10 is ON or OFF. The voltage compensated phase pulse train $\theta_N$ is only present when the main winding TRIAC 31 is ON. Compensation of the width of each phase pulse $\theta_N$ for the effect of line voltage and line voltage variation is achieved by using an appropriate voltage pulse threshold resistor RS5 for each product. A decrease or increase in line voltage with an induction motor 10 operating with a constant mechanical load will respectively decrease or increase the motor 10 phase angle and thereby respectively advance or retard the current pulses of FIG. 3D. Since the leading edge of each voltage pulse precedes the true line voltage zero crossing as shown in FIG. 3, the threshold resistor RS5 may be selected for each product such that the leading edge of each voltage pulse 46 is advanced or retarded by about the same amount that the current pulse is advanced or retarded when a representative motor 10 is operated at a typical mechanical load with a wide range of line voltages. The net result of this procedure is a phase pulse train $\theta_N$ of fully voltage compensated phase pulses $\theta_{fN}$ having a pulse width which varies inversely with the mechanical loading of the motor but which remains substantially constant with any fluctuation in line voltage. Alternatively, a somewhat lower value threshold resistor RS5 may be used to achieve a partial voltage compensation of each phase pulse for applications not requiring a fully compensated phase pulse. The resulting partially compensated phase pulses $\theta_{pN}$ are somewhat narrower than corresponding fully compensated phase pulses $\theta_{fN}$. This provides more available time between two consecutive phase pulses for the microcomputer 50 to perform supervisory routines and may allow somewhat improved resolution of microcomputer analog-to-digital conversion of each phase pulse in applications where an eight-bit word size microcomputer is limited to a resolution of 256 increments per phase pulse.

Each phase pulse $\theta_N$ at input/output line 45 is an independent sample of the mechanical load on the motor 10 for one half cycle. When a single phase fractional horsepower induction motor 10 is operating at virtually no load, the true phase angle is large, i.e., about 65 electrical degrees. The same motor 10 operating at full rated load will have a smaller true phase angle, i.e., about 35 electrical degrees. The phase angle may differ from one motor 10 or appliance unit to another, however, the phase angle of each motor 10 is inversely related to the mechanical load.

In the exemplary embodiment the microcomputer 50 is dedicated throughout the duration of each phase pulse $\theta_N$ to conversion of the analog phase pulse width at input 45 to a binary phase or phase angle number which is stored in a microcomputer data register R. Subsequent processing of the resulting phase number must be accomplished during the four-plus milliseconds between the trailing edge of one phase pulse and the leading edge of the next phase pulse. This is more than enough time for all of the subsequent data processing routines of this disclosure. For example, a microcomputer 50 with an internal microprocessor unit cycle time of two microseconds has sufficient time to process a routine with individual instructions requiring up to 2000 microprocessor unit time cycles. In all cases the microcomputer 50 finishes the data processing routine and is ready for the leading edge of the next phase pulse before the next phase pulse arrives. Alternatively, some microcomputers have a separate pulse timing function which is capable of performing an analog-to-digital conversion of the phase pulse in accordance with the present invention while allowing the microcomputer to perform other tasks.

Two routines for converting the analog input pulse widths $V_N$ or $\theta_N$ to a binary phase number are disclosed. A first routine 100, FIG. 4, uses only the phase pulse at input 45 to convert a single phase pulse to the binary phase or phase angle number which corresponds to either a partial or full voltage compensated phase pulse $\theta_{pN}$ or $\theta_{fN}$, respectively, depending upon the threshold resistor RS5 as previously described. Routine 100 is advantageously called by the basic motor torque averaging routine of FIG. 12 hereinafter described. A second routine 120, FIG. 5, uses both the phase and voltage pulse inputs 46 and 45 to convert a single voltage pulse $V_N$ and phase pulse $\theta_N$ to a binary phase number which corresponds to the true motor phase angle $\theta_t$ independent of the value of the threshold resistor RS5. Routine 120 is advantageously called by a motor start routine, FIG. 7, a vertical-axis clothes washer agitator torque routine, FIG. 10, and the motor phase variability routines of FIGS. 17 and 20.

Figure 4:
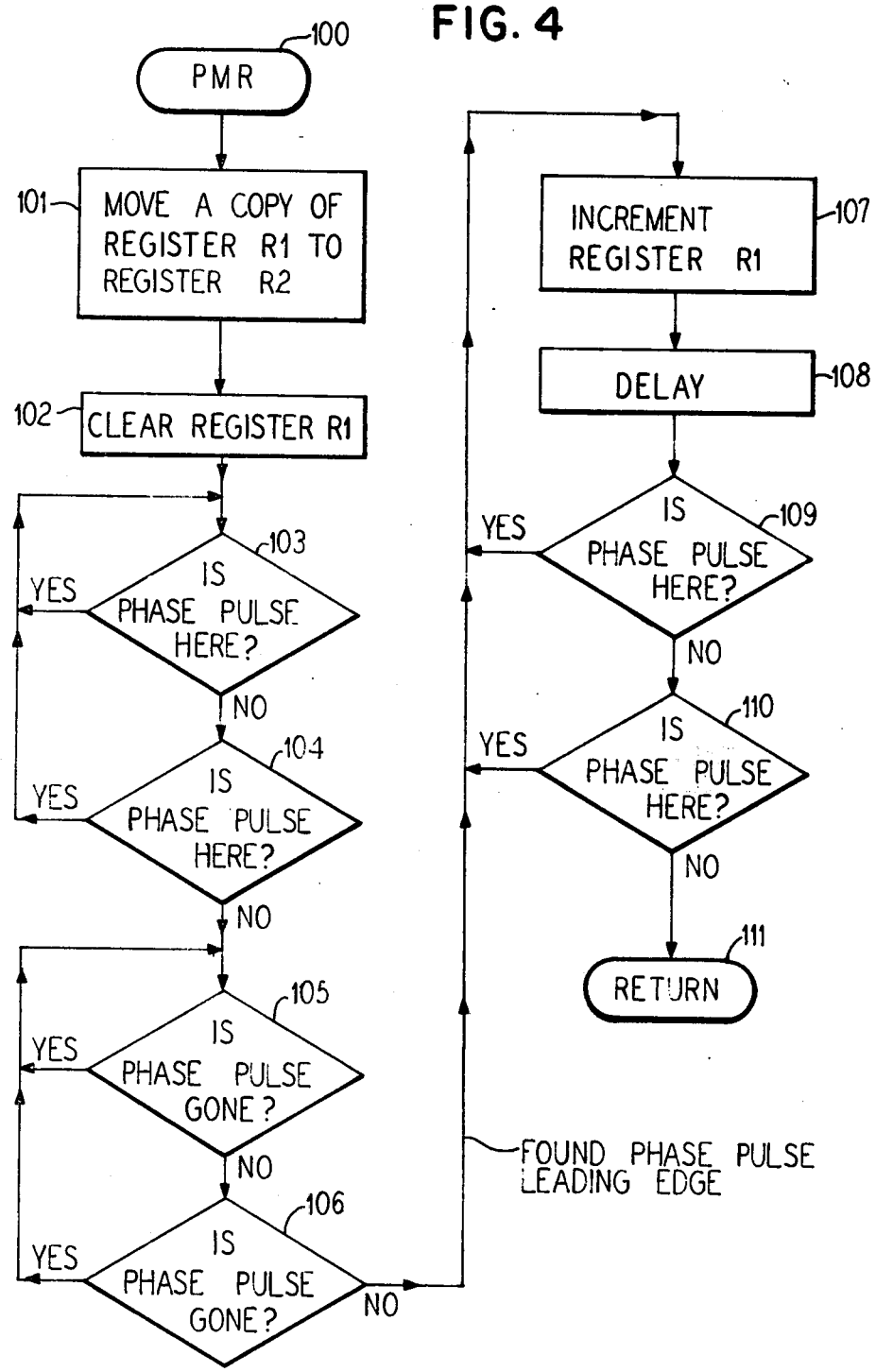
FIG. 4 is a flow chart for a phase monitoring routine PMR for processing the phase pulse signal from the circuit shown in FIG. 2 to compute either partially or fully line voltage compensated motor phase numbers.

FIG. 4 is a microcomputer 50 program flowchart for the phase monitoring routine 100 used to process a single voltage compensated phase pulse $\theta_N$ input from the phase monitoring circuit 40. The routine 100 computes and stores a partially or fully line voltage compensated motor 10 phase number in microcomputer 50 data memory register R1. The microcomputer data memory registers will be numbered sequentially throughout this application, and it will be assumed that each register has a word size of 16 binary bits as may be implemented with a Texas Instruments Incorporated TM9900 microcomputer. Those who are skilled in the art will recognize many opportunities to reduce the required number of microcomputer data registers by time sharing the same register for memory tasks which are non-concurrent. Those skilled in the art will also know how to include additional appropriate programming steps to combine, say, two 8-bit microcomputer 50 data registers to process 16-bit word size information and thereby facilitate implementation of motor 10 phase monitoring with an 8-bit word size microcomputer.

The phase monitoring routine 100 begins by moving a copy of the most previous phase number at register R1 to register R2 at step 101. Many subsequent routines which call routine 100 as a subroutine require each of the last two consecutive phase numbers in memory. The process of moving data from one register to another register as in step 101 does not affect the data stored in the originating register. The procedure for converting the analog pulse width of a phase pulse to a binary number which is stored in data register R1 involves incrementing register R1 at a precise crystal controlled clock rate throughout the duration of a single complete phase pulse. This procedure must not begin in the middle of a phase pulse as, for example, may be the case the first time the routine 100 is called. Decision steps 103, 104, 105 and 106 are used to avoid beginning the conversion process in the middle of a phase pulse and to find the beginning of the next phase pulse.

More specifically, decision step 103 causes the program to loop repeatedly back to step 103 in the event that the routine 100 is called during a phase pulse. Decision step 104 may be included as a digital filter to check again to be sure that the phase pulse is really gone before allowing the program to proceed. Hence, a very brief noise pulse on the phase pulse data line 46 will not affect the ultimate result of the routine 100. Normally, the routine 100 is called between phase pulses and the program falls through decision steps 103 and 104 to decision step 105. The program pauses or loops at decision step 105 until the arrival of the next phase pulse on input line 46. Decision step 106 is another digital filter to avoid misinterpreting any brief noise pulse on the phase pulse input line 46 as the arrival of the next phase pulse. The leading edge of the next phase pulse has been found when the program falls through decision step 106 to step 107.

Program steps 107, 108 and 109 comprise a count loop wherein register R1 is incremented by one unit each time the program passes through the loop. The count loop requires a preset number of precise microcomputer crystal controlled clock cycles for each pass through the loop. The program loops back to step 107 from decision step 109 for the entire duration of the phase pulse. Register R1 is incremented at step 107. Step 108 is optional and may include one or more instructions which have no effect on the program other than to introduce a fixed time delay for the purpose of controlling the overall count loop time. A preferred loop time of 16 microseconds has been found to both provide sufficient phase number resolution for all tasks disclosed in this application and advantageously limit the maximum phase number to less than 256 to avoid word overflow when the present invention is implemented with an 8-bit word size microcomputer. Decision step 109 causes the program to loop back to step 107 for the duration of the sampled phase pulse. Decision step 110 is a digital filter which causes the program to loop back to step 107 in the event of a brief noise pulse on the input line 46. After falling through both decision steps 109 and 110 the program returns at step 111 to the calling program with the last phase number in register R1 and the second to last phase number in register R2. Noise pulses are very rare, and the digital filter steps 104, 106 and 110 may be omitted in some applications.

Figure 5:
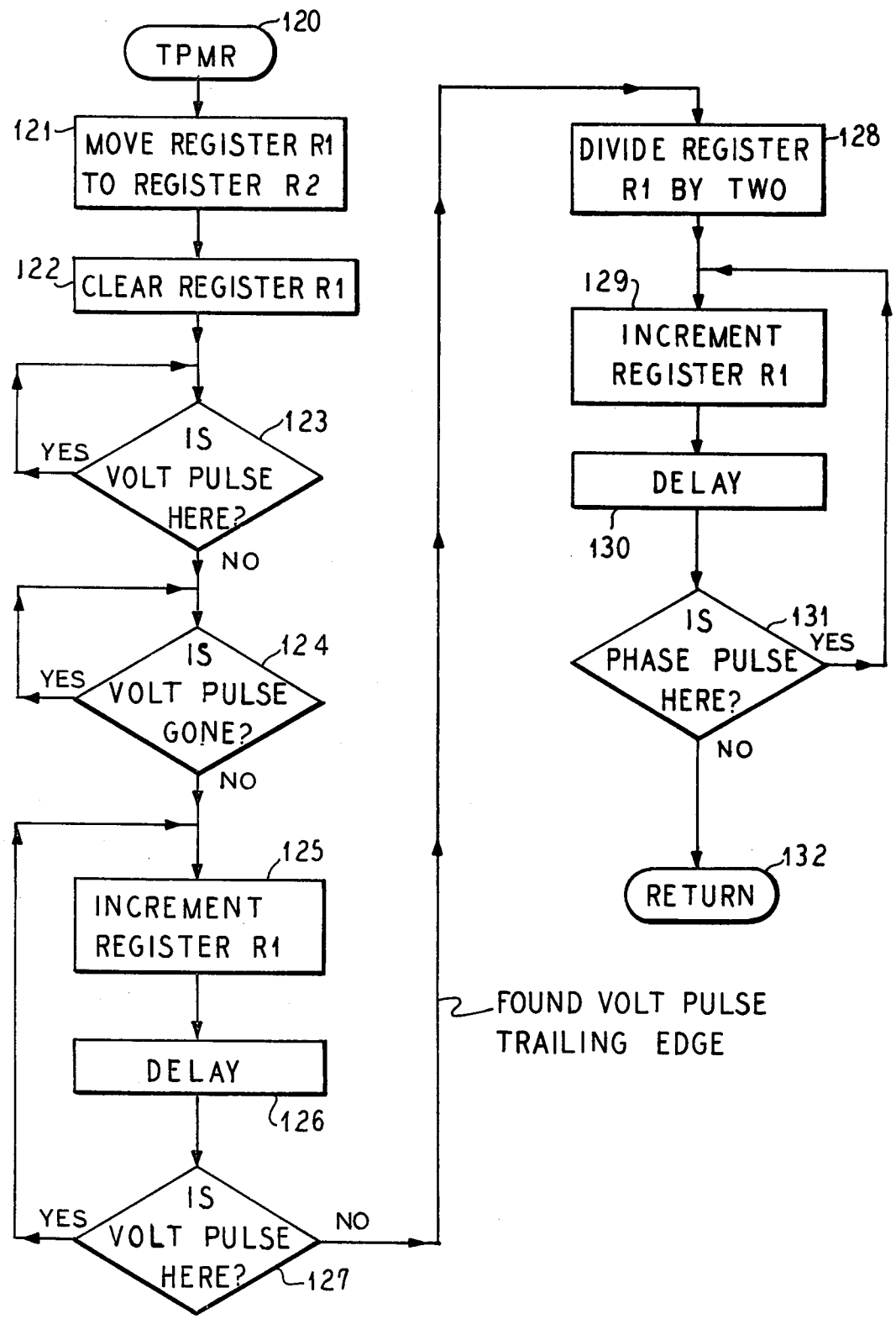
FIG. 5 is a flow chart for a true phase monitoring routine TPMR for processing the phase and voltage pulse signals from the circuit shown in FIG. 2 to compute motor phase numbers corresponding to the true motor phase angle $\theta$.

FIG. 5 is a flowchart for a true phase monitoring routine 120 similar to that shown in FIG. 4 which uses both a voltage pulse $V_N$ and a corresponding phase pulse $\theta_N$ from inputs 46 and 45, respectively, to compute one new motor phase or phase angle number corresponding to the true motor phase angle each time the routine 120 is called. The routine 120 begins by moving the contents of register R1 to register R2 at step 121, clearing register R1 at step 122, finding the leading edge of the next full voltage pulse $V_N$ after falling through decision steps 123 and 124, and converting the analog voltage pulse width to a binary voltage number in register R1 for the duration of the voltage pulse $V_N$ by looping through steps 125, 126 and 127. The program has found the trailing edge of the voltage pulse $V_N$ when it reaches step 128. The binary number in register R1 corresponds to the width of the voltage pulse $V_N$. The binary number in register R1 is divided by two at step 128 by a shift operation common to most microcomputers.

Figure 3A:
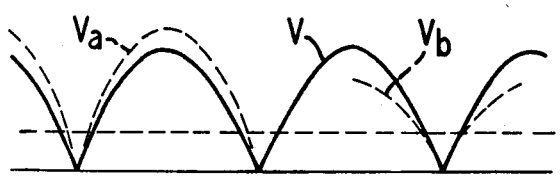
FIG. 3A, 3B, 3C, 3D and 3E is a graphic representation of various waveforms and pulses which are present in the circuit shown in FIG. 2.
Figure 3B:
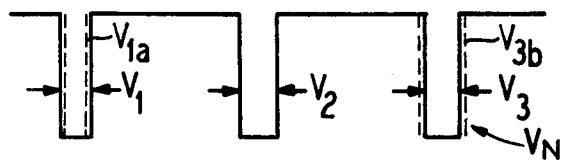
Figure 3C:
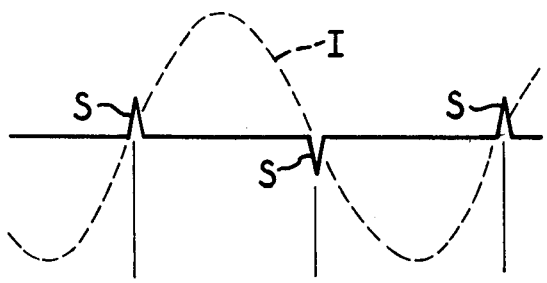
Figure 3D:
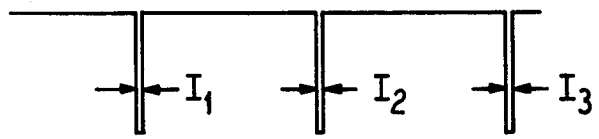
Figure 3E:
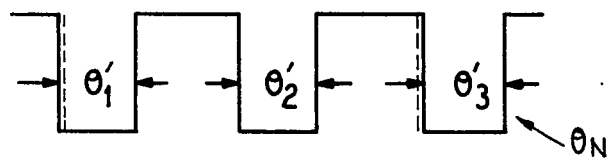

Assuming little or no phase shift of the voltage waveform by the transformer TR, it may be observed by referring to FIGS. 3A and 3B that the number in register R1 after step 128 is the same as if the count loop procedure had begun at the true line voltage zero crossing. Step 128 requires no more than a few microseconds and does not affect the accuracy of the resulting phase number. After completion of step 128 the program falls into a repetitive count loop defined by steps 129, 130 and 131 which continues the process of incrementing register R1 at regular intervals for the duration of the phase pulse $\theta_N$ which corresponds to the above voltage pulse $V_N$. After falling through decision step 131 the program returns at step 132 to the calling program with the last true phase number in register R1 and the second to last true phase number in register R2. Optional digital filter decision steps corresponding to steps 104, 106 and 110 in FIG. 4 may be included following decision steps 123, 124, 127 and 131. Since the voltage pulse $V_N$ is symmetrical about the line voltage zero crossing, the phase numbers returned by routine 120 are relatively independent of the circuit 40 threshold resistor RS5.

With a 60 Hertz AC power source either routine 100 or routine 120 may be called as often as 120 times each second. It will be apparent to those skilled in the art that many variations of routines 100 and 120 are possible which fall within the scope of the present invention. For example, by using a different and somewhat longer delay at step 126 relative to the delay at step 130 the loop time of the voltage pulse count loop at steps 125 through 127 can be made double that of the phase pulse count loop at steps 129 through 131, thereby allowing the elimination of step 128. Also, the delay procedure at step 126 can include a decision step similar to step 131 which causes the routine 120 to return 132 to the calling program if the phase pulse $\theta_N$ should terminate before the arrival of the trailing edge of the voltage pulse. This can happen when both the main and start winding TRIACs 31 and 32 are ON. Alternatively, a modified routine 120 which multiplies the count in register R1 by two at step 128 can be used in conjunction with a small threshold resistor RS5 selected to produce a voltage pulse $V_N$ only half as wide as is normally required to produce a fully voltage compensated phase pulse $\theta_{fN}$, thereby advantageously limiting the width of the phase pulse. Numerous combinations of minor hardware and software modifications are available for producing true phase numbers fully line voltage compensated phase numbers and/or partially line voltage compensated phase numbers advantageously suited to each appliance and task within the scope of the present invention.

Motor Starting

Figure 6:
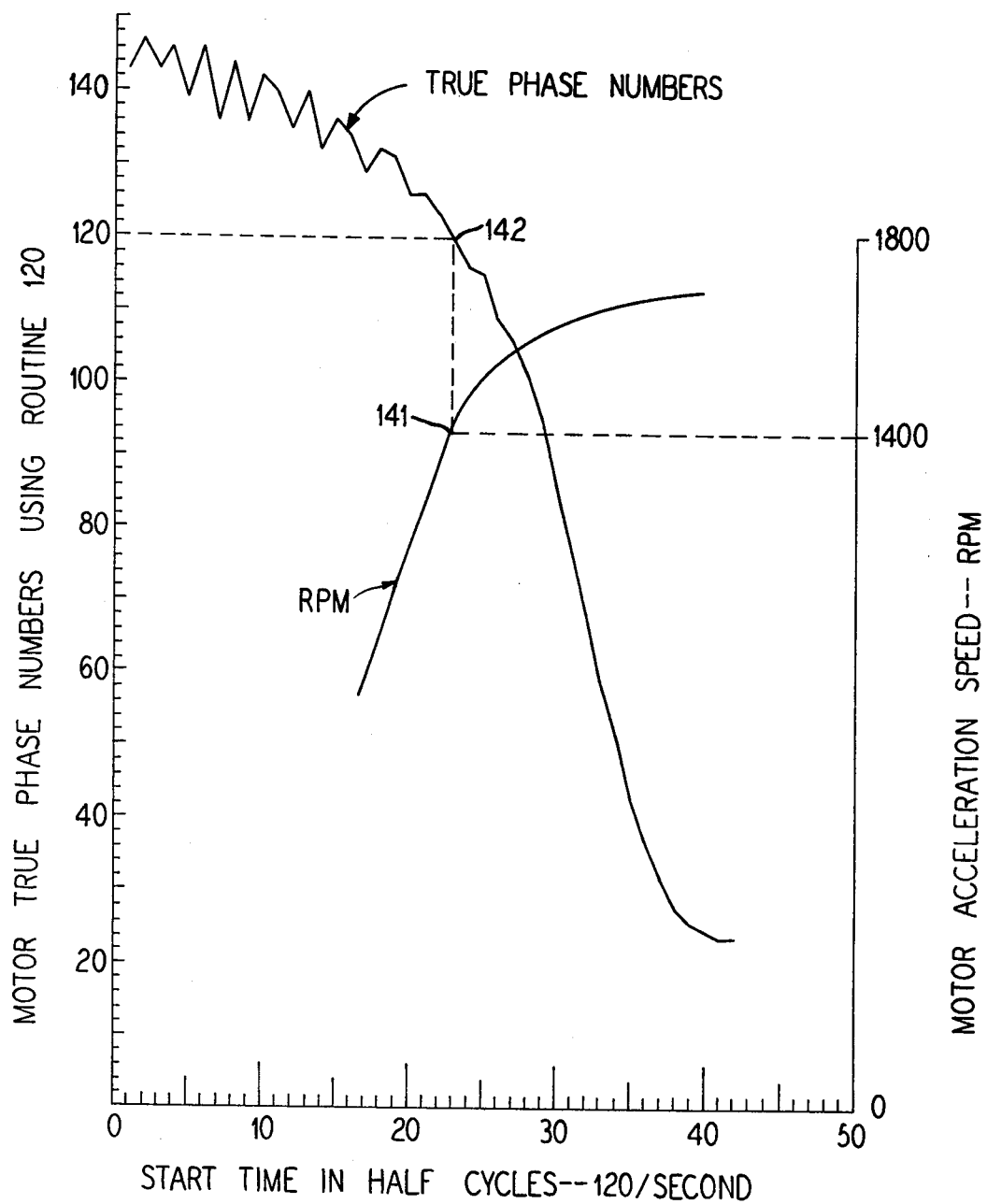
FIG. 6 is a graphic representation of start data of a typical AC induction motor showing a correlation between increasing motor speed and decreasing main winding phase angle with both the main and start windings energized.

A typical relationship between motor speed and the main winding M1 true phase numbers during motor 10 starting with both TRIACs 31 and 32 ON is shown in FIG. 6 wherein the phase number and speed data are plotted on separate vertical axes with respect to a common time axis graduated in half cycles, with 120 half cycles occurring per second. The true phase monitoring routine 120 was called once each half cycle throughout the test. At low motor speed the main winding true phase numbers begin at about 145 and decrease slowly as the motor 10 speed increases. A true phase number of 145 count loop units corresponds to a main winding M1 phase angle of about 50 electrical degrees. As the motor speed nears the point 141 at which the start or auxiliary winding S1 should be de-energized, the motor main winding M1 phase numbers begin a more rapid decrease. The start winding S1 was energized throughout the test to show that the main winding M1 phase numbers continue to decrease beyond the normal cut-out phase threshold 142.

Figure 7:
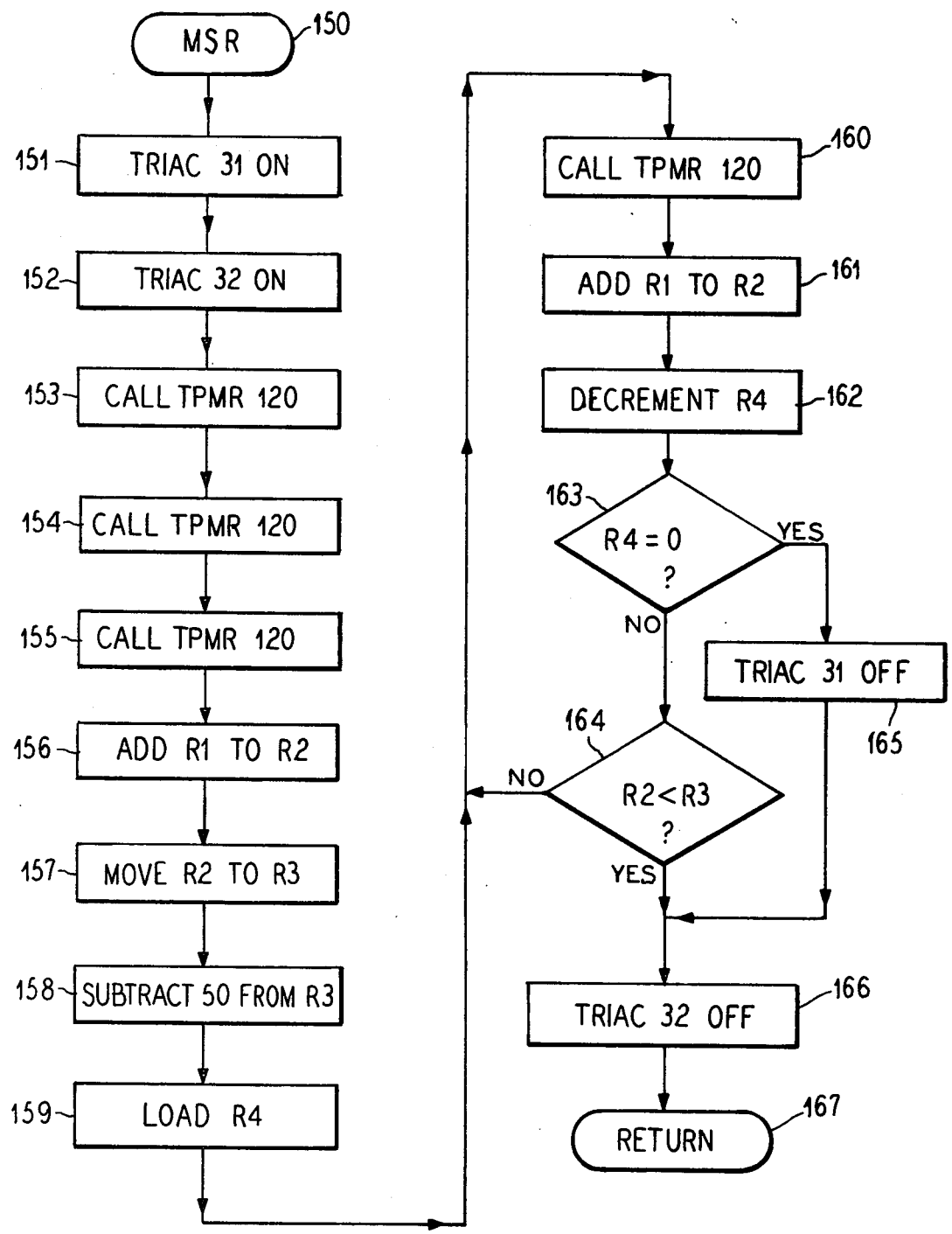
FIG. 7 is a flow chart for a motor start routine MSR which is employed for starting a capacitor-start or split-phase AC induction motor as shown in FIG. 1.

The phase number threshold for start winding S1 cut-out is preferably computed by the microcomputer 50 each time the motor 10 is started because the slow speed true phase numbers obtained during the first few half cycles may vary with the installation line voltage, the motor main winding M1 and start winding S1 temperature and between individual motor production units. Also, experience has shown that the initial phase angle at which the TRIACs 31 and 32 are turned ON can have a considerable effect on the first returned phase number from routine 120 and can cause some perturbation in subsequent low speed odd/even half cycle phase numbers. A motor start routine 150 is shown in FIG. 7 wherein a phase number threshold is computed each time the motor 10 is started by summing the returned slow speed phase numbers from the second and third half cycle and subtracting a preset bias number appropriate for each motor type and desired cut-out speed. The true phase monitoring routine 120 returns with the last two true phase numbers available in registers R1 and R2. The motor start routine 150 continues to call the routine 120 once each half cycle until either the sum of the last two phase numbers is below the threshold, in which case the motor has started, or until a preset half cycle time limit has expired, in which case all power is removed from the motor 10.

More specifically, the motor start routine 150 begins by turning the motor 10 main winding TRIAC 31 on at step 151. The motor start winding TRIAC 32 is turned ON less than a few microseconds later at step 152. The true phase monitoring routine 120 of FIG. 5 is called as a subroutine of the motor start routine 150 at step 153. Following completion of the subroutine 120 at step 132 program control returns to the next step 154 of the main routine 150. The last phase number in register R1 after step 153 is not used to compute a start threshold because the initial phase angle at which TRIACs 31 and 32 were turned ON is not controlled. The true phase monitoring routine 120 is called on each of the two next half cycles at steps 154 and 155. This loads both the last phase number and the second to last phase number registers R1 and R2, respectively. The start threshold is now computed and stored at register R3 in steps 156, 157 and 158. At step 156 the binary last phase number stored at register R1 is added to the second to last phase number at register R2 and the sum is stored at register R2. The last phase number at register R1 is not affected by this process. At step 157 the sum of the last two phase numbers is copied from register R2 to register R3 to avoid losing the threshold number the next time routine 120 is called. At step 158 a threshold bias of 50 is subtracted from the number in register R3 and the resulting start threshold is stored in register R3. A preset half cycle time limit is loaded in register R4 at step 159. For example, if register R4 is loaded with 120 at step 159, the motor start time limit would be one second plus the three half cycles required to complete steps 153, 154 and 155.

After completion of step 159 the program control passes to a loop defined by steps 160, 161, 162, 163 and 164 which loops until either the motor start time limit has been reached at decision step 163 or the start criterion has been satisfied at decision step 164. The true phase monitoring routine 120 is called at step 160. The routine 120 returns with the last and second to last phase numbers at registers R1 and R2, respectively. Register R1 is added to register R2 without affecting the contents of register R1 at step 161. The half cycle count register R4 is decremented at step 162. Decision step 163 terminates the program via step 165 if the half cycle count register R4 has been decremented to zero. The main winding TRIAC 31 is turned OFF at step 165 and program control is passed to step 166 if the time limit is exceeded. Otherwise, the program falls through decision step 163 to decision step 164. If the sum of the last two phase numbers at register R2 is less than the start threshold at register R3 the motor 10 has achieved the desired start winding cut-out speed and the program control passes to step 166. Otherwise, the program branches back to step 160 to get the next phase number.

The start winding TRIAC 32 is turned OFF at step 166 and program control is returned to the calling program at step 167. The motor 10 has started if the number in register R4 is not equal to zero. It will be understood by those skilled in the art that the start time limit loaded in register R4 at step 159 may vary with each product or application, and the start threshold bias at step 158 may be varied with the desired start winding cut-out speed. For example, if a motor 10 is to be run with a 6-pole, 1200 RPM main winding M2' but started with 4-pole main and start windings M2 and S1, the desired start winding cut-out speed is 1200 RPM, and step 158 may be changed to subtract 40 from R3 to achieve start winding S1 cut-out at 1200 RPM rather than 1400 RPM. The routine 150 would also be modified to turn the main winding TRIAC 31 OFF and the appropriate 6-pole main winding M2' TRIAC ON before returning at step 167.

Any program which calls the motor start routine 150 as a subroutine can verify that the motor did start by checking register R4. The start threshold remains in register R3 and is available for subsequent diagnostic tasks. Alternatively, program steps 153, 154, 155 and 160 could call the voltage compensated phase monitoring routine 100, although for the purpose of motor starting it is preferable to use the true phase numbers for consistent start winding S1 cut-out RPM over a wide range of voltage and motor start load conditions.

Figure 8:
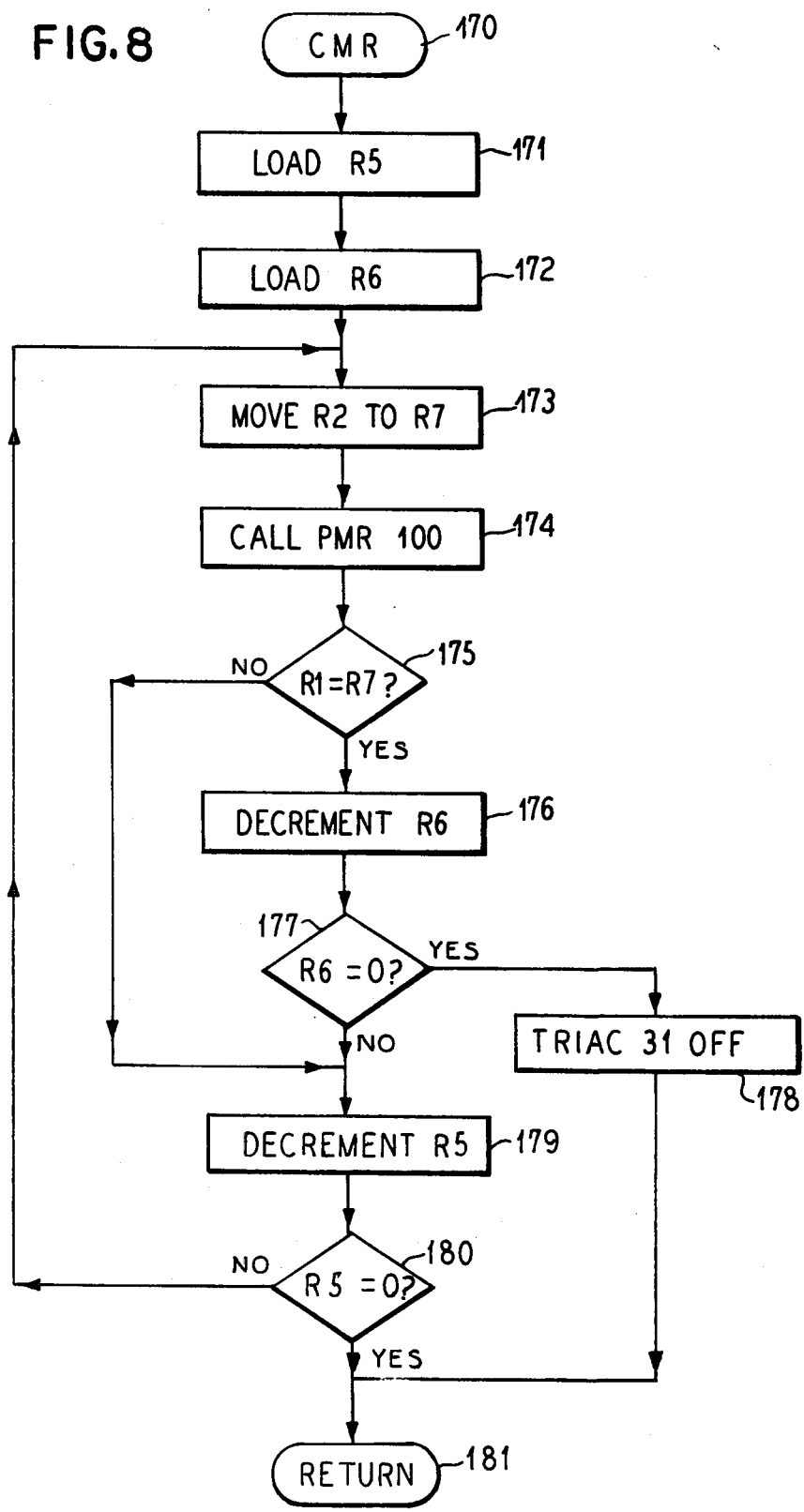
FIG. 8 is a flow chart for a check motor routine CMR which calls the phase monitoring routine of FIG. 4 and is employed to detect and protect a stalled motor.

FIG. 8 is a flowchart for a check motor routine 170 which is used to detect and protect a stalled motor 10 (See FIG. 1) before the stall condition is detected by the thermal overload protector 11. The mechanical load and resulting phase number are never completely constant when any appliance motor 10 is operating normally at a design RPM. A high percentage of consecutive, identical phase numbers is an indication that the motor 10 has stalled. However, in many installations a stalled motor is not detected by comparing consecutive phase numbers in registers R1 and R2 because any asymmetry between the positive and negative power source half cycles may cause a difference in consecutive half cycle phase numbers even when the motor is stalled. Also, small differences between the phase monitoring circuit 40 comparator circuits CM2 and CM3 can result in a systematic difference between odd and even half cycle phase numbers. Routine 170 avoids any odd-/even half cycle asymmetry problems by storing the second to last phase number in a separate memory register R7 before calling the phase monitoring routine 100 and making all comparisons between the last phase number and the third to last phase number. The routine 170 determines if a preset number of alternate half cycle phase numbers are equal within an optimum minimum sample duration window determined separately for each product type.

More specifically, the check motor routine 170 begins by loading register R5 with the sample window duration in half cycles at step 171. Register R6 is loaded with a stall threshold count number at step 172. Optimal numbers vary with each product. For a clothes washer the sample duration register R5 is loaded with 60 and the stall threshold count register is loaded with 35. The second to last phase number at register R2 is moved to register R7 at step 173. This number becomes the third to last phase number after step 174 wherein the phase monitoring routine 100 is called. The program returns from subroutine 100 to decision step 175 wherein the last phase number at register R1 is compared to the third to last phase number at register R7. If the numbers are not equal, the program skips to step 179. Otherwise, the stall count register R6 is decremented at step 176 and compared to zero at decision step 177. If register R6 is zero, the motor is stalled and hence the main winding TRIAC 31 is turned OFF at step 178. Otherwise, the sample duration register R5 is decremented at step 179. If decision step 180 determines that register R5 is zero, the program returns to a calling program at step 181 with the motor 10 operating normally and register R6 not equal to zero. Otherwise, the program loops back to step 173 to prepare for the next data point. Alternatively, the true phase monitoring routine 120 could be called at step 174 instead of the phase monitoring routine. In actual practice the check motor routine 170 is seldom used alone. Those skilled in the art will know how to include a sequence of program steps which are similar to the check motor routine 170 as a portion of all subsequent task oriented routines to simultaneously check for a stalled motor condition while also using the returned voltage compensated phase numbers from routine 100 or true phase numbers from routine 120 to perform an appliance control task; i.e., automatically filling a clothes washing machine.

Vertical-Axis Washer Water Level Control

Figure 9A:
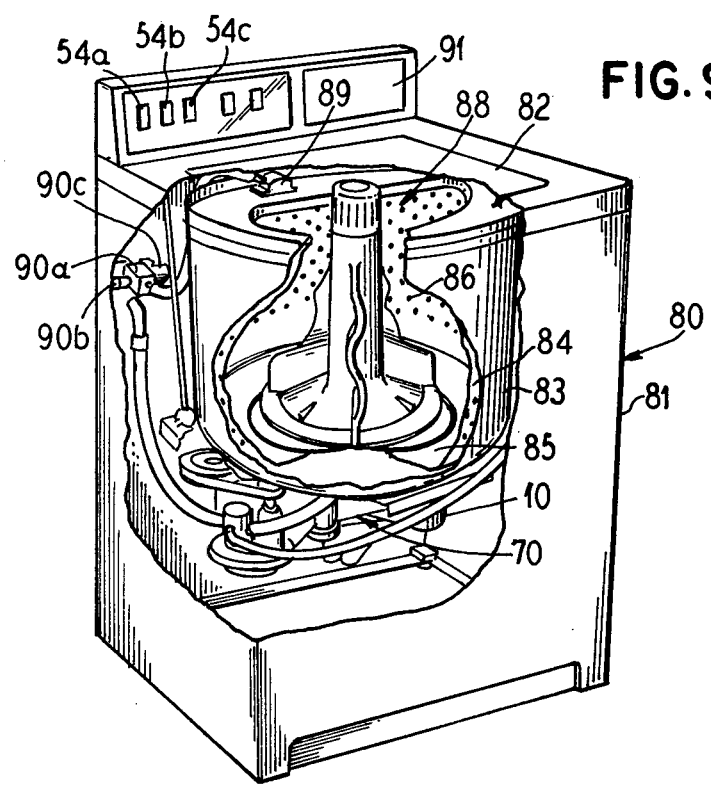
FIG. 9a shows a vertical-axis clothes washer employing the present invention.

The appliance control of FIG. 1 as applied to a top-loading vertical-axis clothes washer 80 is shown in FIG. 9a. The washing machine comprises a cabinet 81 having a hinged lid 82 for permitting access to the interior of the machine 80. Within the cabinet 81 is an imperforate fluid retaining tub 83 and a perforate washing receptacle or basket 84 mounted coaxially therewithin. The basket 84 has a lower wall 85 and a side wall 86, the wall 86 being generally cylindrical.

An agitator 88 is mounted coaxially within the tub 83 and the basket 84. Transmission or driving means 70 driven by motor 10 drives the agitator 88 in repetitive rotational oscillations (agitation) within the clothes washing receptacle or basket 84. An agitate solenoid (not shown) and a spin solenoid (not shown) control the transmission 70 to drive the agitator 88 in agitation or the basket 84 in a spin drying portion of the wash cycle. Washing liquid enters the receptacle 84 through a water inlet 89 from water inlet valve 90a under the control of hot and cold water solenoids 90b and 90c. The washer 80 preferably uses 4-pole motor 10 main winding M1 and start winding S1 for normal agitation, and a second 6-pole motor winding (not shown) for slow speed agitation. Each of the above motor and solenoid windings is controlled by a separate TRIAC (not shown), TRIAC driver circuit (not shown) and microcomputer 50 binary output line 53. As previously described, the additional motor 10 main winding (not shown) is also wired in series with a two-turn sensor core primary winding (not shown). The exemplary vertical-axis clothes washer control includes a console 91 also using three binary inputs to the microcomputer 50 from console switches 54a, 54b and 54c to allow user selection of NORMAL, PERMANENT PRESS or DELICATE cycles and two additional binary inputs from tub water level pressure switches 54d and 54e in console 91. Pressure switch 54d defines a factory preset minimum water level. In the preferred embodiment low speed agitation of the clothes begins when the tub water level is at the minimum water level. The second pressure switch 54e defines a factory preset maximum water level for the machine and thereby prevents water overflow. Neither water level pressure switch is accessible to the user from the console 91.

Figure 9B:
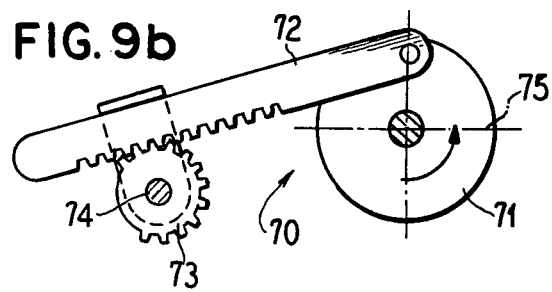
FIGS. 9b and 9c show a vertical-axis clothes washer drive transmission means in positions requiring maximum and minimum motor torque, respectively.
Figure 9C:
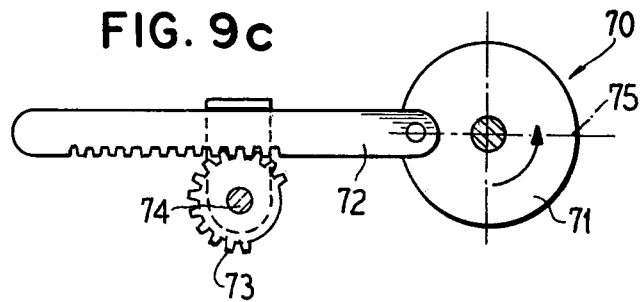

The transmission 70 of the exemplary vertical-axis clothes washer is illustrated in FIGS. 9b and 9c and comprises a main gear 71, a connecting rod 72 and an agitate gear 73. The main gear 71 is driven by a speed reduction mechanism which is driven by the motor 10. The connecting rod 72 translates the circular motion of the main gear 71 into an oscillatory motion of the agitate gear 73. The vertical shaft 74 of the agitate gear is connected to the clothes agitator 88. The agitate gear 73 and shaft 74 traverse one clockwise and one counterclockwise arc or stroke for each complete revolution of the main gear 71. The agitator is connected to the vertical shaft 74, and hence the agitator completes one clockwise and one counterclockwise stroke for each revolution of the main gear 71. During each agitator stroke there is a time when the connecting rod 72 is at either a top-dead-center or a bottom-dead-center position with respect to the center axis 75 of the main gear 71, where virtually none of the mechanical clothes torque load on the agitator is transmitted through the transmission 70 to the motor 10. FIG. 9c shows the connecting rod 72 in the bottom-dead-center position. Also, during each agitator stroke there is a time when the connecting rod 72 is displaced by approximately 90 mechanical degrees from the top or bottom-dead-center position and all of the mechanical clothes torque load on agitator is transmitted to the motor 10. FIG. 9b shows the connecting rod 72 displaced by 90 degrees from the top or bottom-dead-center positions.

Thus, within each clockwise and counterclockwise agitator stroke the motor torque required to drive the agitator experiences a maximum and a minimum value with corresponding minimum and maximum phase numbers, respectively. Two complete cycles of maximum and minimum motor torque are completed with each revolution of the main gear 71. The difference between the maximum and minimum sum of two consecutive phase numbers within each agitator stroke is advantageously directly related to the mechanical clothes load torque on the agitator and inversely related to the magnitude of the line voltage and corresponding motor breakdown torque. Also, the difference numbers are largely independent of various extraneous factors such as transmission 70 gear friction, motor 10 friction and belt tension. The difference numbers are used as a basis for vertical-axis washer automatic water level control. No special effort is necessary to synchronize the start of the data collection with a specific initial agitator position.

Figure 10:
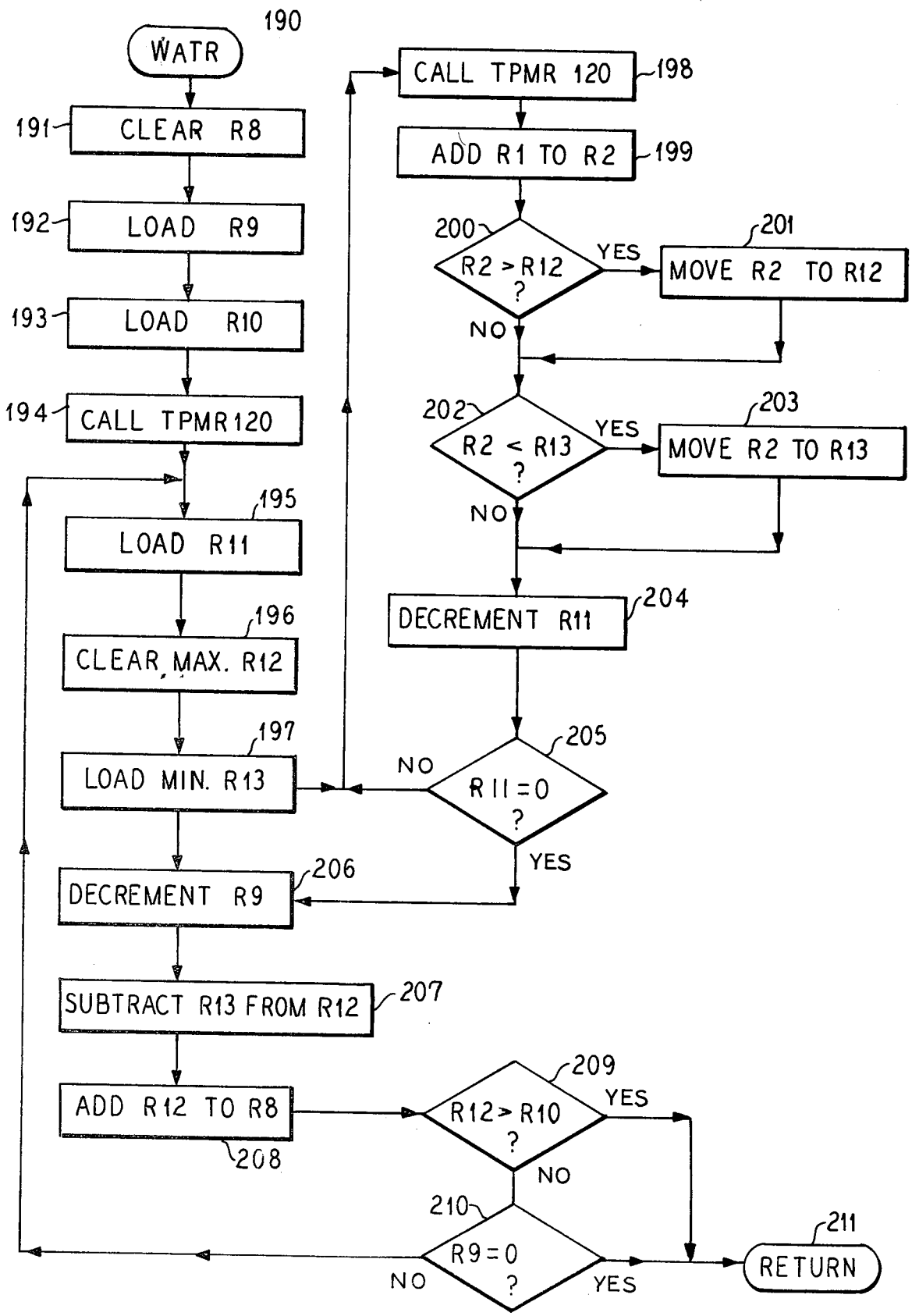
FIG. 10 is a flow chart for a vertical-axis clothes washer agitator torque routine WATR which is employed to compute a number which corresponds to the sum of the difference between the maximum and minimum torque load on the motor within each agitator stroke for a preset number of strokes.

FIG. 10 is a flowchart for a vertical-axis clothes washer agitator torque routine 190 which is employed to compute a number which corresponds to the sum of the difference between the maximum and minimum torque load on the motor 10 within each agitator stroke for a preset number of strokes. The routine 190 begins at step 191 by clearing a register R8 at which the above sum of the single stroke differences will be maintained. At step 192 a register R9 is loaded with a preset number of agitator strokes for which the above difference numbers are to be summed. At step 193 a register R10 is loaded with a preset single stroke threshold number for rapid detection of a water level condition wherein there is a gross insufficiency of water for the clothes load. For the exemplary embodiment register R9 is loaded with 12 and register R10 is loaded with 125. The true phase monitoring routine 120 is called at step 194 to load the last phase number register R1 with current data.

At step 195 a half cycle count register R11 is loaded with the number of half cycles per agitator stroke. At low speed the exemplary machine requires 82 half cycles to complete a single direction agitator stroke. Register R12 is cleared at step 196. Register R12 is used to store the maximum sum of two consecutive true phase numbers during the data collection process for each stroke. Similarly, register R13 is loaded with a high number at step 197. Register R13 is used to store the minimum sum of two consecutive true phase numbers during the data collection process for each stroke.

Program steps 198 through 205 define an inner loop wherein the true phase monitoring routine 120 is called repeatedly for the required number of half cycles for the machine to complete one agitator stroke and the maximum and minimum sum of two consecutive true phase numbers is stored in registers R12 and R13, respectively. More specifically, the true phase monitoring routine 120 is called at step 198. The routine 120 returns with current data in the last and second to last phase number registers R1 and R2, respectively. At step 199 the last phase number at register R1 is added to the second to last phase number at register R2 without affecting the last phase number stored at register R1. Decision step 200 causes the program to move the last sum of two consecutive phase numbers at register R2 to register R12 via step 201 if the number in register R2 is higher than the previous maximum in storage at register R12. Otherwise, the program falls through decision step 200 to decision step 202. Decision step 202 causes the program to move the last sum of two consecutive phase numbers at register R2 to register R13 via step 203 if the number in register R2 is lower than the previous minimum in storage at register R13. Otherwise, the program falls through decision step 202 to step 204. The half cycle count register R11 is decremented at step 204. Decision step 205 causes the program to branch back to step 198 if register R11 is not zero. When the half cycle count register R11 has been decremented to zero the program falls through decision step 205 to step 206.

An agitator stroke count register R9 is decremented at step 206. At step 207 the minimum sum of two consecutive phase numbers for the last agitator stroke at register R13 is subtracted from the maximum sum of two consecutive phase numbers at register R12. The difference number is stored at register R12. At step 208 the last difference number at register R12 is added to the grand sum for all agitator strokes at register R8. Decision step 209 causes the program to return before completion of the preset number of agitator strokes if the last difference number at register R12 exceeds the single stroke threshold number previously loaded at register R10. Otherwise, the program falls through decision step 209 to decision step 210. Decision step 210 causes the program to branch back to step 195 if the agitator stroke count register R9 has not been decremented to zero. Otherwise, the program falls through decision step 210 and returns at step 211 to the calling program with the sum of the difference numbers in register R8. The calling program may interrogate register R9 to determine if the single stroke threshold was exceeded before completion of the last stroke.

Figure 11:
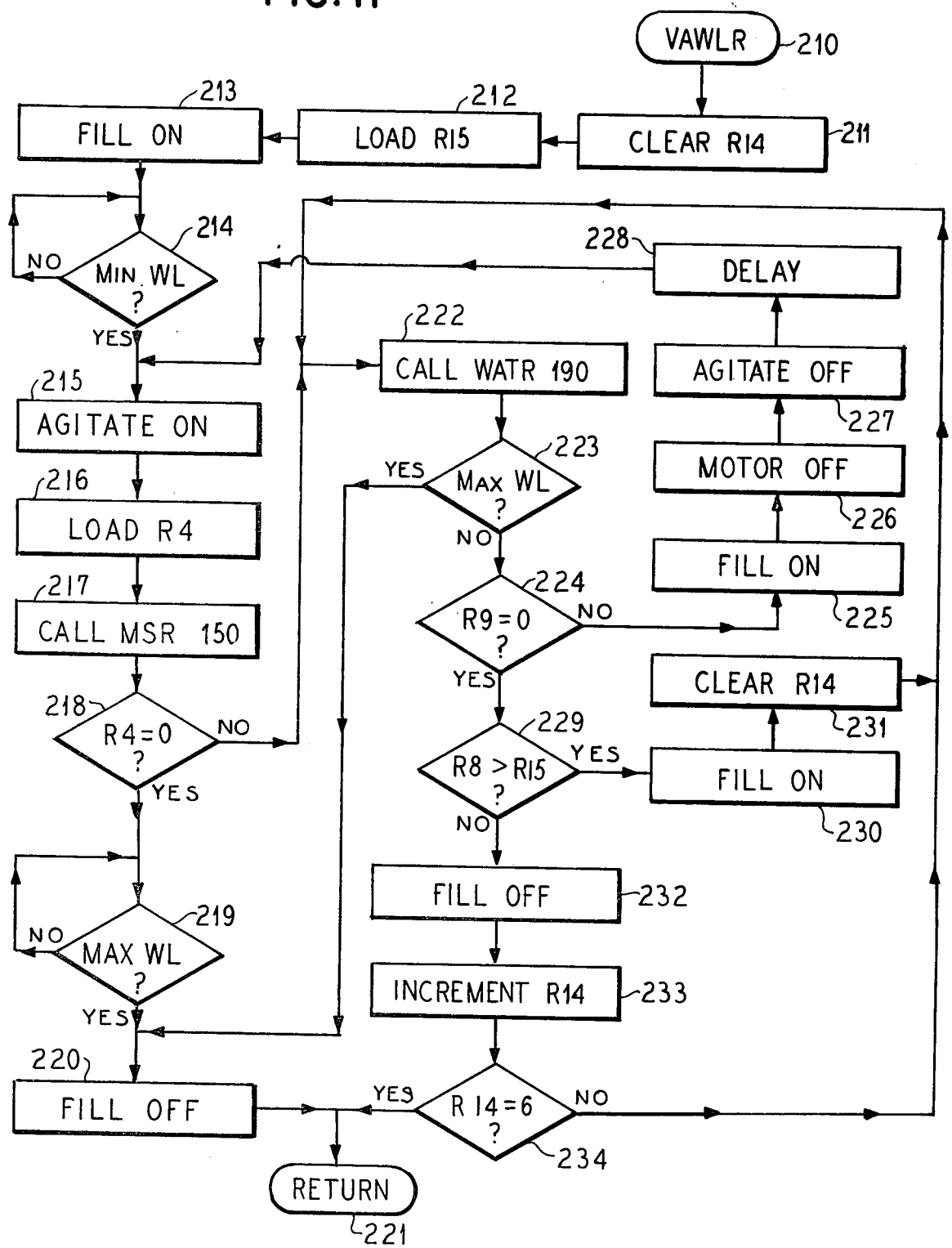
FIG. 11 is a flow chart for a supervisory vertical-axis clothes washer automatic water level routine VAWLR which calls the motor start routine of FIG. 7 and the washer agitator torque routine of FIG. 10 and is employed to compare the sum of the difference number of FIG. 10 to a fill threshold to determine when to terminate the water fill.

FIG. 11 is a flowchart for a supervisory vertical-axis clothes washer automatic water level routine 210 which calls the washer agitator torque routine 190 and is employed to compare the returned sum of difference numbers at register R8 to a preset fill threshold for the purpose of providing an automatic water level control. The routine begins at step 211 by clearing a count register R14. The function of register R14 will be described later. At step 212 a preset fill threshold corresponding to the user cycle selection (NORMAL, PERMANENT PRESS or DELICATE) and fill type (hot or warm wash fill; cold rinse fill) is loaded at register R15. For example, a warm or hot water wash fill with a PERMANENT PRESS clothes load may have a fill threshold 325. Corresponding NORMAL or DELICATE cycle selections have respectively higher and lower fill thresholds. The cold water rinse fill thresholds are all somewhat lower than the corresponding hot or warm water NORMAL, PERMANENT PRESS or DELICATE fill thresholds to advantageously provide a somewhat higher cold water rinse fill water level. The hot and/or cold water fill solenoids 90b and 90c of fill valve 90a are turned ON at step 213. Decision step 214 introduces a delay until the minimum water level pressure switch 54d is set. The microcomputer 50 monitors the amount of time required for the water to reach the minimum level.

The agitator solenoid (not shown) is turned ON at step 215. At step 216 the half cycle time limit register R4 for the motor start routine 150 is loaded with 40. The motor start routine 150 minus step 159 is called at step 217. The motor start routine 150 is also modified to subtract 40 from register R3 at step 158 and switch from the 4-pole main winding M1 to the 6-pole main winding (not shown) before returning at step 167 when the motor 10 has successfully started. The motor 10 will not start within the above time limit when the washer is packed with a very large clothes load because the clothes load provides sufficient drag on the agitator to limit the motor acceleration. If the motor 10 does not start, the routine 150 returns with zero in register R4 and the program falls through decision step 218 to decision step 219. Decision step 219 introduces a delay until the maximum water level pressure switch is set. The fill is turned OFF at step 220 and the program returns at step 221 to the calling program. Hence, a means is provided whereby the maximum water level is automatically provided with no clothes agitation when the washer is packed with a very large clothes load.

Normally, the motor 10 will start and register R4 will not be zero at decision step 218. In this case the program branches to step 222 wherein the above washer agitator torque routine 190 is called. After completion of routine 190 the program returns to step 223. If the maximum water level has been reached, the fill procedure is finished and the program jumps to step 220. Otherwise, the program falls through decision step 223 to decision step 224. If the washer agitator torque routine 190 is terminated before completion of the preset number of agitator strokes by a single stroke clothes overload, register R9 will not be zero and the program jumps to step 225. The appropriate fill solenoids 90b and/or 90c are turned ON at step 225. Step 225 has no effect if the fill solenoids 90b and 90c are already ON. The motor 10 is turned OFF at step 226. The agitate solenoid (not shown) is turned OFF at step 227. Step 228 introduces a time delay of one half the time required for the original fill to reach the minimum water level at decision step 214. Program control is returned to step 215 with a higher water level in the machine. Hence, steps 225 through 228 provide a second means of avoiding excessive clothes agitation when a gross insufficiency of water is available for a given clothes load.

Normally, register R9 is zero and the program falls through decision step 224 to decision step 229. If the returned agitator torque number at register R8 from routine 190 is greater than the fill threshold number at register R15, the program jumps to step 230. The appropriate fill solenoids 90b and/or 90c are turned ON at step 230. Step 230 has no effect if the fill solenoids 90b and 90c are already ON. Count register R14 is cleared at step 231 and the program loops back to step 222 with the motor 10 ON and the washer in the agitation mode. Otherwise, if register R8 is not greater than register R15 the program falls through decision step 229 to step 232. The fill solenoids 90b and/or 90c are turned OFF at step 232. Step 232 has no effect if the fill solenoids 90b and 90c are already OFF. Count register R14 is incremented at step 233. Decision step 234 terminates the fill procedure if register R14 has been incremented on six consecutive program passes through decision step 229. Otherwise, the program loops back to step 222. This provides time for some clothes rollover within the wash basket which may alter the clothes density in the area of the agitator and thereby affect the returned agitator torque numbers at register R8. After completion of the automatic water level control procedure the motor 10 may be switched from the low speed, 6-pole main winding (not shown) to the high speed, 4-pole main winding M1 for high speed clothes agitation. The fill procedure is complete.

Motor Torque Averaging Applications

Figure 12:
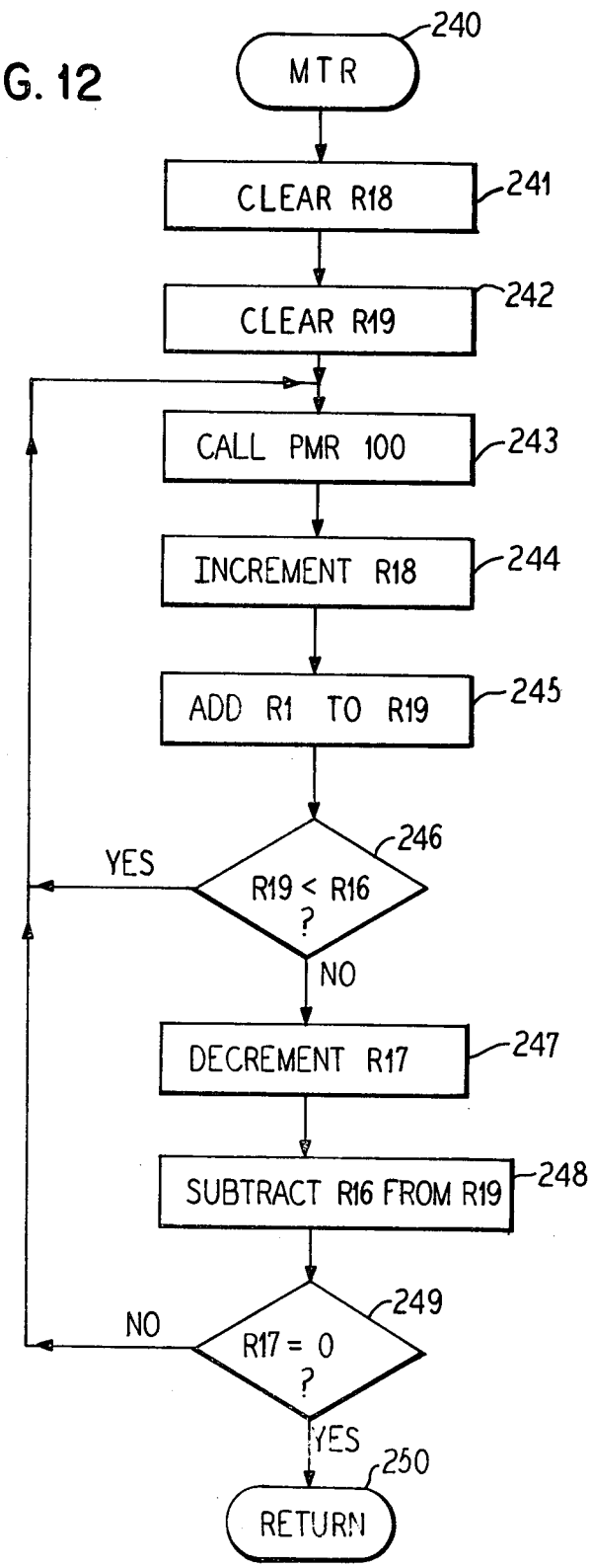
FIG. 12 is a flow chart for a basic motor torque averaging routine MTR which preferably calls the phase monitoring routine of FIG. 4.

FIG. 12 is a flowchart for a general purpose motor torque averaging routine 240 which preferably calls the voltage compensated phase monitoring routine 100 and monitors the number of half cycles required for the sum of the returned phase numbers at register R1 to reach or exceed a preset large number. Since each returned phase number at register R1 is inversely related to the instantaneous motor 10 torque, the time as measured in the number of half cycles required to complete routine 240 is directly related to the average motor 10 torque. As will be described in the flowcharts of FIGS. 13, 14, 15 and 16 the motor torque averaging routine 240 includes two registers R16 and R17 which must be appropriately loaded by the calling program before the routine 240 is called. Register R16 is loaded with a high count limit such as 32,000 and register R17 is loaded with a loop count such as four. For a loop count of four and a high count limit of 32,000 the routine 240 computes the number of consecutive half cycles required for the sum of the phase numbers at register R1 to equal or exceed 128,000. Hence, the approximate duration of the motor 10 torque averaging period is controlled by the calling program.

More specifically, the motor torque averaging routine 240 begins by clearing a half cycle count register R18 at step 241. Upon completion of the routine 240 the number which corresponds to the average motor torque is in register R18. A phase number summation register R19 is cleared at step 242. The voltage compensated phase monitoring routine 100 is called at step 243. It is preferable to use the voltage compensated phase monitoring routine 100 to generate fully compensated phase numbers for the purpose of motor torque monitoring to facilitate comparison of a sequence of motor torque numbers which are substantially independent of any variation in line voltage. The half cycle count register R18 is incremented at step 244. The last phase number at register R1 is added to the contents of the phase number summation register R19 at step 245. Decision step 246 causes the program to branch back to step 243 if the sum at register R19 is less than the high count limit previously loaded at a register R16 by the calling program. The program falls through decision step 246 to step 247 when the sum at register R19 is equal to or greater than the high count limit at register R16. A loop count register R17 previously loaded by the calling program is decremented at step 247. The high count limit at register R16 is subtracted from the sum at register R19 and the difference is placed in register R19 at step 248. Step 248 is necessary to retain any excess amount by which the sum at register R19 exceeded the high count limit at register R16 at step 246. Decision step 249 causes the program to branch back to step 243 if the loop count register R17 is not zero. The loop count register R17 is necessary because the maximum number which can be stored at the sum register R19 is limited by the register bit count. The program falls through decision step 249 to return at step 250 to the calling program when the loop count register R17 has been decremented to zero. The routine returns to the calling program with the average motor torque number at register R18. It will be apparent to those skilled in the art that the motor torque averaging routine 240 could be used to monitor the average line voltage by changing steps 103, 104, 105, 106, 109 and 110 of the phase monitoring routine 100 to monitor the voltage pulse 46 rather than the phase pulse 45.

Figure 13:
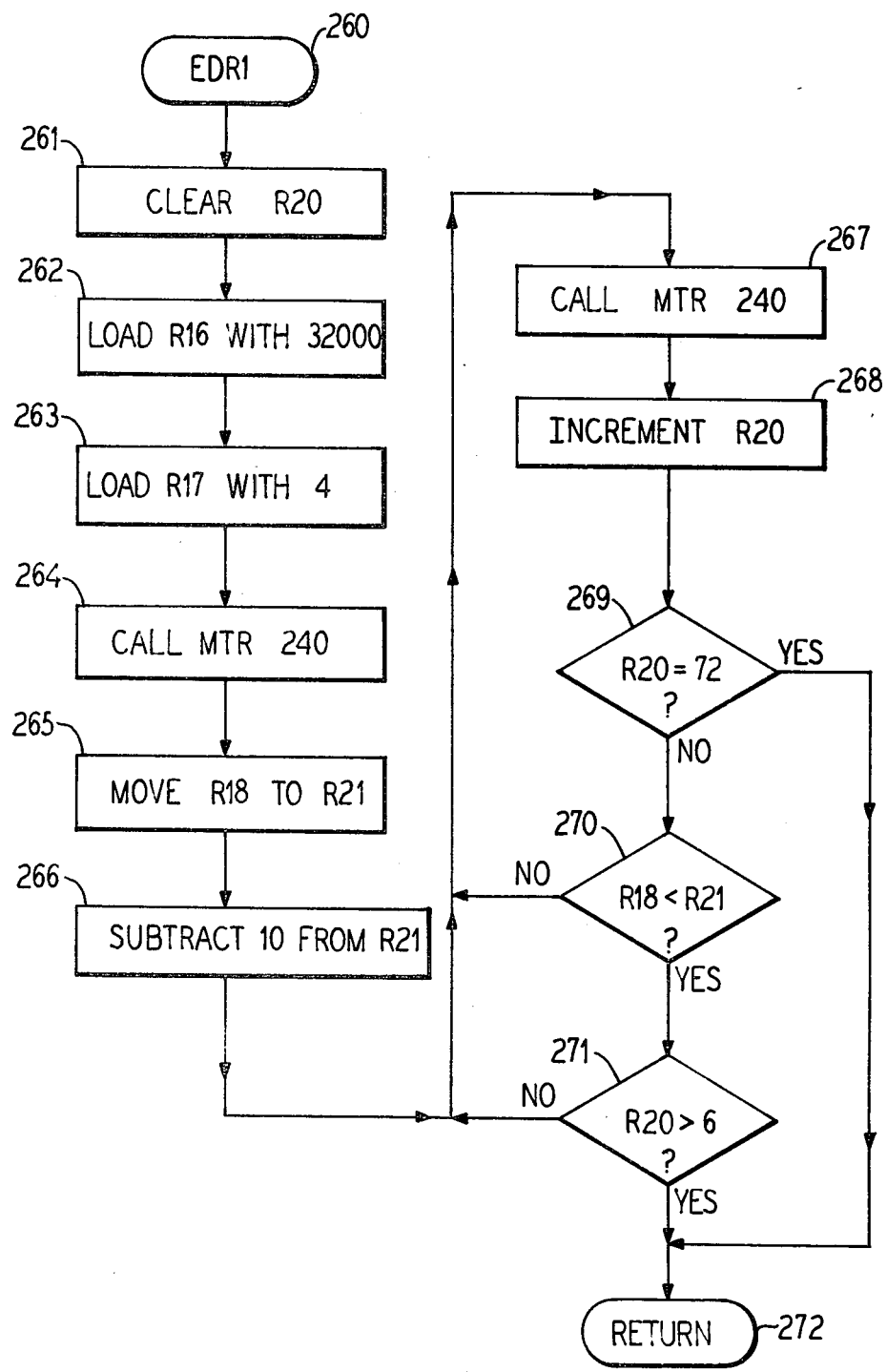
FIG. 13 is a flow chart for a supervisory dishwasher or clothes washer end-of-drain routine EDR1 which calls the motor torque averaging routine of FIG. 12 and is employed to detect when substantially all of the water has been discharged into a drain line.

FIG. 13 is a flowchart for a supervisory dishwasher or clothes washer end-of-drain routine 260 which calls the motor torque averaging routine 240 and is employed to detect the decrease in average motor torque which occurs when substantially all of the water has been discharged into the drain line. The routine 260 may be called within a few seconds after the dishwasher or clothes washer has established a water drain or pump out mode. The routine 260 begins at step 261 by clearing a count register R20. The motor torque averaging routine 240 high count register R16 is loaded with 32,000 at step 262. The routine 240 loop count register R17 is loaded with 4 at step 263. The motor torque averaging routine 240 is called at step 264 to establish a base line sample of motor torque with the motor 10 loaded by the work of the pump in the process of pumping water from the machine. The returned average motor torque number at register R18 is moved to register R21 at step 265. A threshold is established by subtracting a fixed bias number of 10 from the number at register R21 at step 266. The approximate processing time or duration of the routine 240 is determined by the numbers loaded in registers R16 and R17 respectively at steps 262 and 263. For the present example the processing time for routine 240 is about five seconds. The remaining portion of routine 240 is structured to detect the decrease in motor torque which occurs when substantially all the water has been pumped from the machine and to set approximate maximum and minimum time limits on the overall drain procedure.

More specifically, the motor torque averaging routine 240 is called at step 267. A count register R20 is incremented at step 268. Decision step 269 terminates the program by branching to step 272 if register R20 is 72. This defines an approximate maximum drain time of 72 times 5 seconds or 6 minutes. Normally, the program falls through decision step 269 to decision step 270. Decision step 270 causes the program to branch back to step 267 if the last average motor torque number at register R18 is not less than the threshold torque number at register R21. In other words, the program branches back to step 267 if the last torque number at register R18 is equal to or higher than the threshold number at register R21 as is the case when a continuous stream of water is still being pumped from the machine. If the last torque number at register R18 is less than the threshold number at register R21, the program falls through decision step 270 to decision step 271. Decision step 271 defines an approximate minimum drain time of 7 times 5 seconds or 35 seconds. If the count register R20 is not greater than 6, the program branches back to step 267. Otherwise, the program falls through decision step 271 and returns at step 272 to the calling program with the drain completed.

Figure 14A:
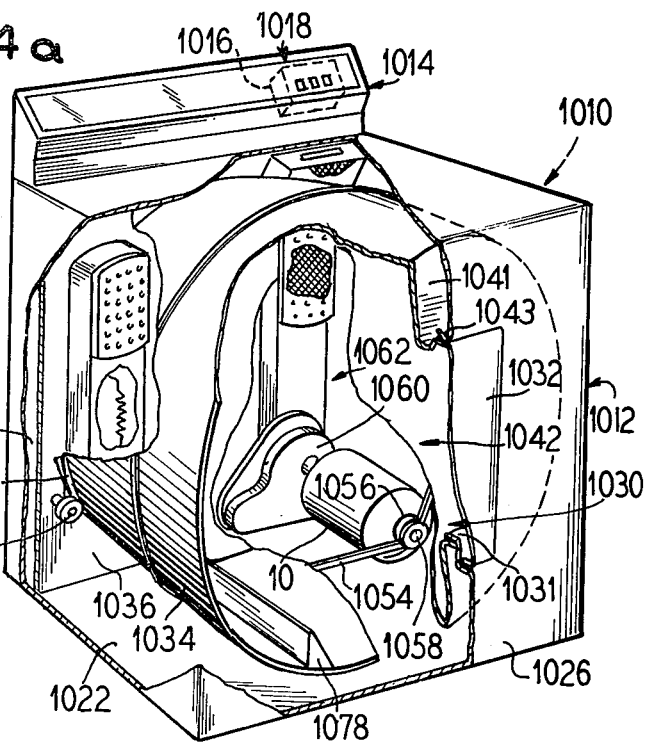
FIG. 14a shows a clothes dryer employing the present invention.

FIG. 14a discloses a clothes drying appliance 1010 which utilizes the instant invention to determine clothes dryness. The dryer 1010 comprises an enclosure cabinet 1012 with a control console 1014 thereon, housing a control device 1016 utilizing the control circuitry described in FIGS. 1 and 2 for regulating the drying operation. Control buttons 1018 selectively sets the control device 1016 for various drying cycles of operation as, for example, automatic or timed drying cycles. An access opening 1030 as defined by an axially in-turned flange 1031 is provided in a front panel 1026 having a closure door 1032 cooperating therewith for loading and unloading the dryer 1010. The dryer 1010 further includes a drying container for tumbling clothes, in the form of a rotatable drum 1034 housed within the cabinet 1012 and extending axially from the front panel 1026 to a bulkhead 1036 spaced forwardly of a rear panel 1028. To encourage tumbling action in the clothing being dried, a plurality of circumferentially spaced baffles 1078 (only one being illustrated) are mounted on the inner surface of the drum 1034. The drum 1034 includes a radially inwardly extending front closure wall 1041 having an access opening 1042 therein formed by means of an axially out-turned flange 1043. The flange 1043 provides a forwardly extending bearing annulus which overlies and is suitably journalled on the complemental flange 1031 of the cabinet 1012. It will be apparent from the foregoing that the opening 1042 into the drum 1034 and the opening 1030 formed in the front panel 1026 are concentric and provide access into the rotatable drum 1034 from outside the cabinet 1012. The drum 1034 is supported at the rear by a pair of support rollers 1048 (only one being illustrated) mounted on the bulkhead 1036. A raceway or circumferential groove 1050 indented into the peripheral wall of the rear portion of the drum 1034 serves as a track for the rollers 1048.

Motor 10, mounted to the bottom panel 1022 in a rear corner of the cabinet 1012, rotatably drives the drum 1034 by means of a drive belt 1054 extending around the periphery of and in frictional engagement with the drum 1034 and around a motor pulley 1056 which is mounted at one end of a motor shaft 1058. The other end of the motor shaft 1058 drives a blower 1060, arranged to circulate air through the drum 1034. The blower 1060 is included in a warm air system 1062 positioned between the rear panel 1028 and the bulkhead 1036 to provide a drying environment for clothes placed in the drum 1034.

Figure 14B:
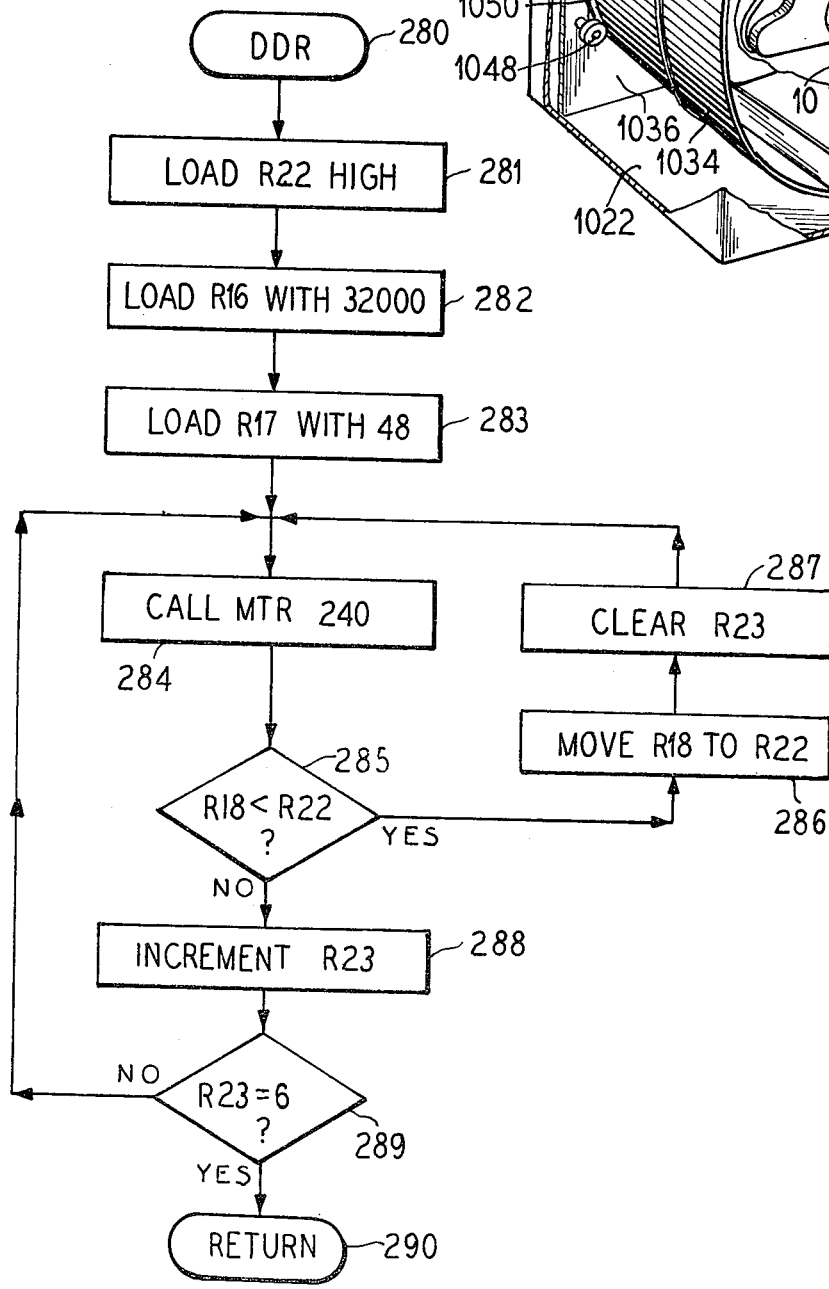
FIG. 14b is a flow chart for a supervisory clothes dryer dryness sensing routine DDR which calls the motor torque averaging routine of FIG. 12 and is employed to detect when the average motor torque is no longer decreasing and the clothes are dry.

FIG. 14b is a flowchart for a supervisory clothes dryer dryness sensing routine 280 for the dryer 10 to determine clothes dryness. The routine 280 calls the motor torque averaging routine 240 and is employed to detect when the average motor torque is no longer decreasing. Throughout a drying cycle a clothes load tumbling in drum 1034 loses weight due to the evaporation of water, and the average motor torque required to revolve the drum shows a general decrease until the clothes are dry. The dryer dryness routine 280 begins at step 281 by loading register R22 with a very high number. Register R22 is used to store the minimum returned motor torque number throughout the dry cycle. The motor torque averaging routine 240 high count register R16 is loaded with 32,000 at step 282. The routine 240 loop count register R17 is loaded with 48 at step 283. The motor torque is averaged for about one minute with the above numbers in registers R16 and R17. The motor torque averaging routine 240 is called at step 284. Decision step 285 causes the program to go to step 286 if the last returned motor torque number at register R18 is less than the previous minimum torque number at register R22. The program always goes to step 286 the first time through because a very high number is initially loaded in register R22 at step 281. The last average motor torque number at register R18 is moved to register R22 at step 286. A count register R23 is cleared at step 287. After performing step 287 the program branches back to step 284. When the motor torque number at register R18 is not less than the motor torque number at register R22, the program falls through decision step 285 to step 288. The count register R23 is incremented at step 288. Decision step 289 causes the program to branch back to step 284 if register R23 is not equal to 6. When the motor torque routine 240 has not returned a new minimum average motor torque number at register R18 on sixty consecutive passes through decision step 285, the program falls through decision step 289 to return at step 290 to the calling program. The dry cycle may be terminated upon return to the calling program in control 1016 after an appropriate cool down period.

Figure 15A:
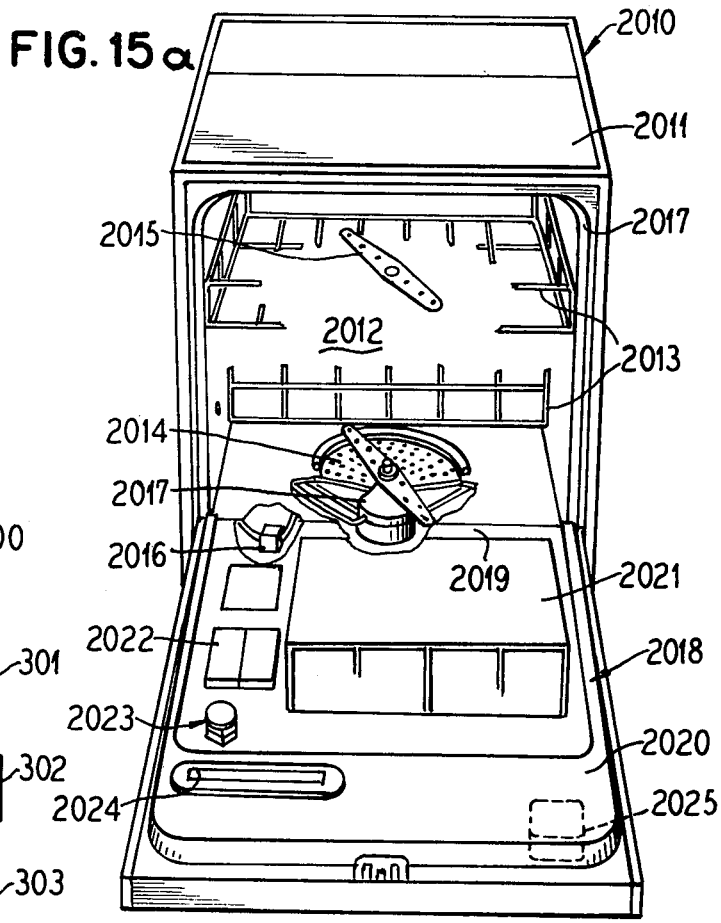
FIG. 15a discloses a dishwasher employing the present invention.

The instant invention can also be utilized to improve the efficiency of a dishwasher 2010 shown in FIG. 15a. The dishwasher 2010 is shown to comprise a cabinet 2011 defining a washing chamber 2012. Dishes to be washed are carried in chamber 2012 on suitable racks 2013 and are adapted to be sprayed with washing liquid by a main rotating spray device 2014 and an auxiliary upper rotating spray device 2015. Delivery of water to chamber 2012 for circulation by spray device 2014 is controlled by means of a suitable inlet valve 2016. Motor 10 rotates a pumping means 2017 to provide washing liquid to spray means 2014 and 2015 or alternatively when driven in a reverse rotation to a drain (not shown).

Cabinet 2011 defines a front opening 2017 which may be selectively closed by a door 2018 mounted to cabinet 2011 for swinging movement about a horizontal axis at the lower end 2019 thereof.

The door is provided with an inner panel 2020 carrying a silverware basket 2021, a detergent dispenser 2022, a rinse additive dispenser 2023, and a vent 2024 for discharging humid air from chamber 2012 during the drying cycle. A control 2025 employing the circuitry of FIGS. 1 and 2 may be mounted in door 2018 for controlling the automatic operation of the dishwasher.

Figure 15B:
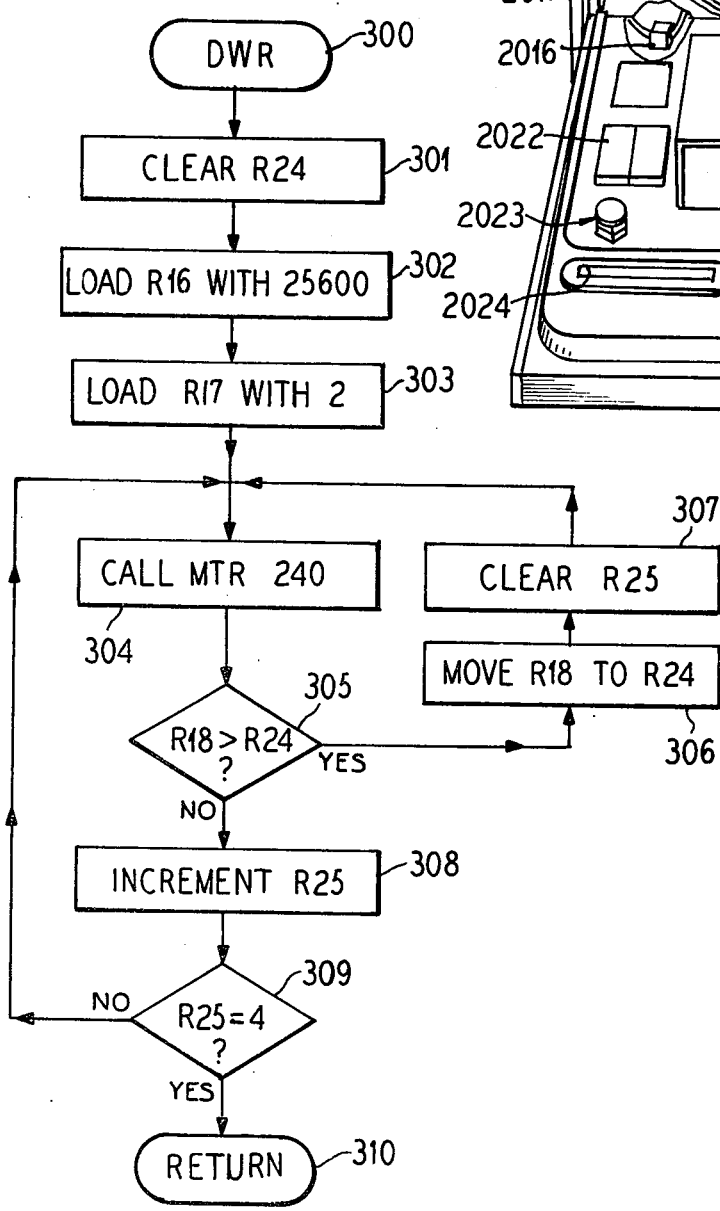
FIG. 15b is a flow chart for a supervisory dishwasher automatic water level routine DWR which calls the motor torque averaging routine of FIG. 12 and is employed to terminate the water fill when the average motor torque is no longer increasing and the pump flow rate has reached a maximum.

FIG. 15b is a flowchart for a supervisory dishwasher automatic water level routine 300 included in control 2025 which calls the motor torque averaging routine 240 and is employed to terminate the water fill in chamber 2012 when the average motor torque is no longer increasing and the pump flow rate to spray means 2014 and 2015 has reached a maximum. Routine 300 is the compliment of dryer dryness routine 280 in that the motor torque routine 240 is used to terminate a procedure which has reached a maximum rather than a minimum. Also, the motor torque averaging periods are much shorter in routine 300 than routine 280. The main winding M1 of the dishwasher motor 10 is ON and the pump means 2017 is pumping water throughout the fill procedure. The appliance control of FIG. 1 as applied to the dishwasher 2010 preferably uses a 2-pole motor with main and start windings M1 and S1, a second 2-pole start winding (not shown) for starting the motor 10 in the opposite direction and a hot water solenoid (not shown) for controlling the operation of valve 2016. The routine 300 may be called a few seconds after the beginning of the fill procedure when some inlet water has reached the pumping means 2017. The dishwasher automatic water level routine 300 begins at step 301 by clearing a register R24. Register R24 is used to store the maximum returned motor torque number throughout the fill procedure. The motor torque averaging routine 240 high count register R16 is loaded with 25,600 at step 302. A loop count register R17 is loaded with 2 at step 303. The motor torque is averaged for about two seconds with the above numbers in registers R16 and R17. The motor torque averaging routine 240 is called at step 304. Decision step 305 causes the program to go to step 306 if the last returned motor torque number at register R18 is greater than the previous maximum torque number at register R24. The program always goes to step 306 on the first pass because register R24 is cleared at step 301. The last average motor torque number at register R18 is moved to register R24 at step 306. A count register R25 is cleared at step 307. After performing step 307 the program branches back to step 304. Otherwise, the count register R25 is incremented at step 308. Decision step 309 causes the program to branch back to step 304 if register R25 is not equal to four. When the motor torque routine 240 has not returned with a new maximum average motor torque number at register R18 on four consecutive passes through decision step 305, the program falls through decision step 309 to return 310 to the calling program. The dishwasher water fill is terminated by the calling program in control 2025 by de-energization of valve 2016.

Figure 16A:
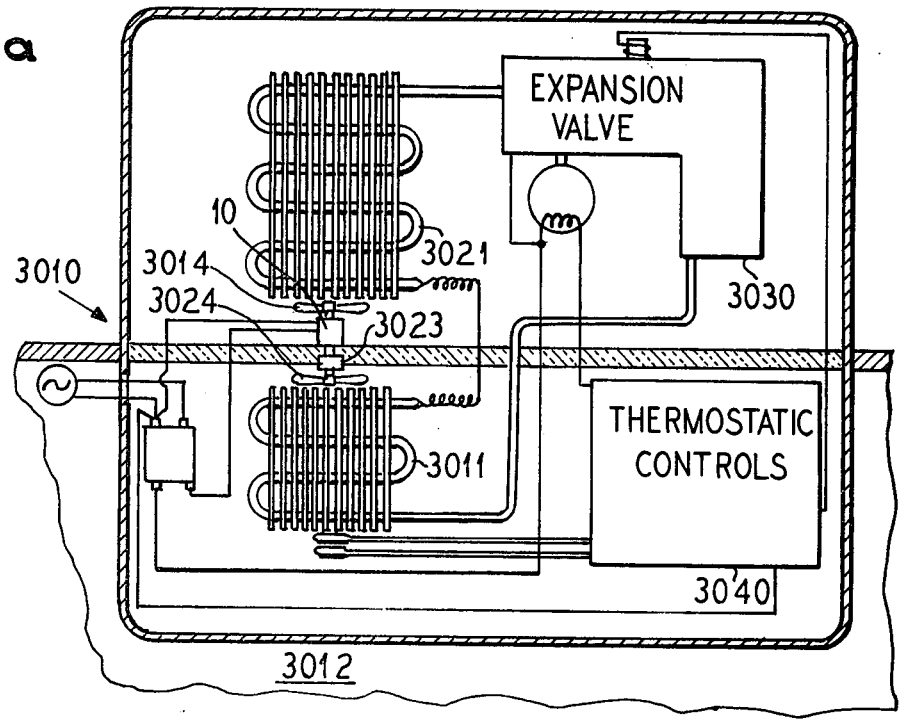
FIG. 16a is a heat pump employing the present invention.
Figure 16B:
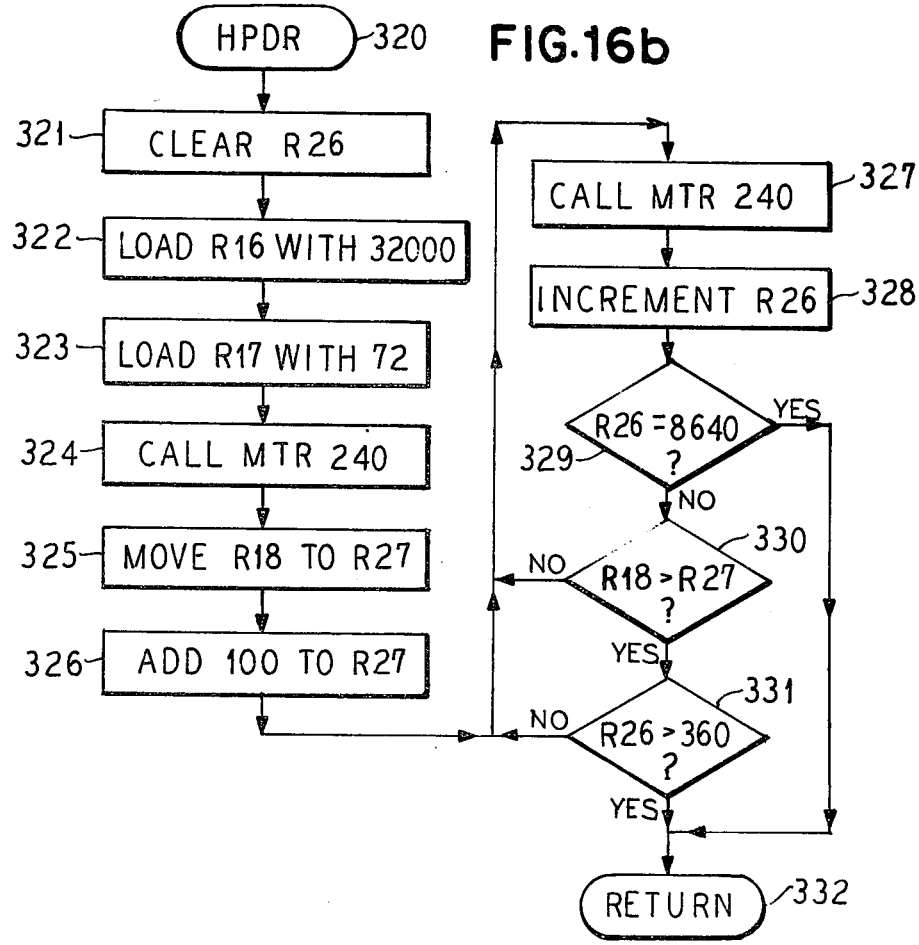
FIG. 16b is a flow chart for a supervisory heat pump demand defrost routine HPDR which calls the motor torque averaging routine of FIG. 12 and is employed to initiate an outdoor evaporator defrost cycle.

FIG. 16b is a flowchart for a supervisory heat pump demand defrost routine 320. The routine 320 is utilized in a household heat pump system 3010 as shown in FIG. 16a. The system includes a heat exchanger 3011 in an enclosed space 3012 and a heat exchanger 3021 subject to the outdoor environment. Fan motors 10 and 3023 drive fans 3014 and 3024 respectively. A compressor 3030 is provided in a refrigerant loop including the exchangers 3011 and 3012 as is well known in the art. A control 3040 including a portion similar to FIGS. 1 and 2 is provided to control the operation of the compressor, fan motors and valve. Routine 320 forms a portion of control 3040 and calls the motor torque averaging routine 240 and is employed to initiate an outdoor heat exchanger defrost cycle when sufficient ice blockage has occurred to cause the average outdoor heat exchanger fan motor 10 torque to increase by a preset amount above a base line average torque sample when the heat exchanger 3011 is free of frost. The heat pump demand defrost routine 320 may be called a few minutes after completion of a defrost cycle with the compressor 3030 and outdoor heat exchanger fan motor 10 operating. The sensor core 20 two-turn primary winding 21 is wired in series with the outdoor heat exchanger fan motor 10. For a 240 volt power source the neutral line N as shown in FIG. 1 is replaced by the L2 power source line.

The heat pump demand defrost routine 320 begins at step 321 by clearing a count register R26. The motor torque averaging routine 240 high count register R16 is loaded with 32,000 at step 322. The routine 240 loop count register R17 is loaded with 72 at step 323. The fan motor torque is averaged for about 90 seconds with the above numbers in registers R16 and R17. The motor torque averaging routine 240 is called at step 324. The returned torque number at register R18 is moved to register R27 at step 325. A numerical bias of 100 is added to the number at register R27 at step 326. The defrost torque threshold is thereby stored at register R27. Steps 324 through 326 define an automatic referencing procedure which eliminates the need for any factory or field installation calibration procedures for each unit.

The motor torque averaging torque routine 240 is called at step 327. The count register R26 is incremented at step 328. Decision step 329 causes the program to jump to step 332 and return to the calling program if the count register R26 is equal to 8640. This provides a maximum interval between defrosting operations of about four days. Otherwise, the program falls through decision step 329 to decision step 330. Decision step 330 causes the program to branch back to step 327 if the last returned fan motor torque number at register R18 is not greater than the defrost torque threshold at register R27. Thus the program continues to branch back to step 327 until the outdoor heat exchanger ice blockage is sufficient to cause the outdoor fan motor torque to exceed the threshold established following the most previous defrost cycle. When the last returned torque number at register R18 is greater than the defrost torque number at register R27, the program falls through decision step 330 to decision step 331. Decision step 331 causes the program to branch back to step 327 if the count register is not greater than 360. This defines a minimum interval between defrosting operations of about four hours. Otherwise, the program falls through decision step 331 to return at step 332 to the calling program. The calling program in control 3040 will initiate a defrost cycle at this point.

Motor Phase Variability Applications

Figure 17:
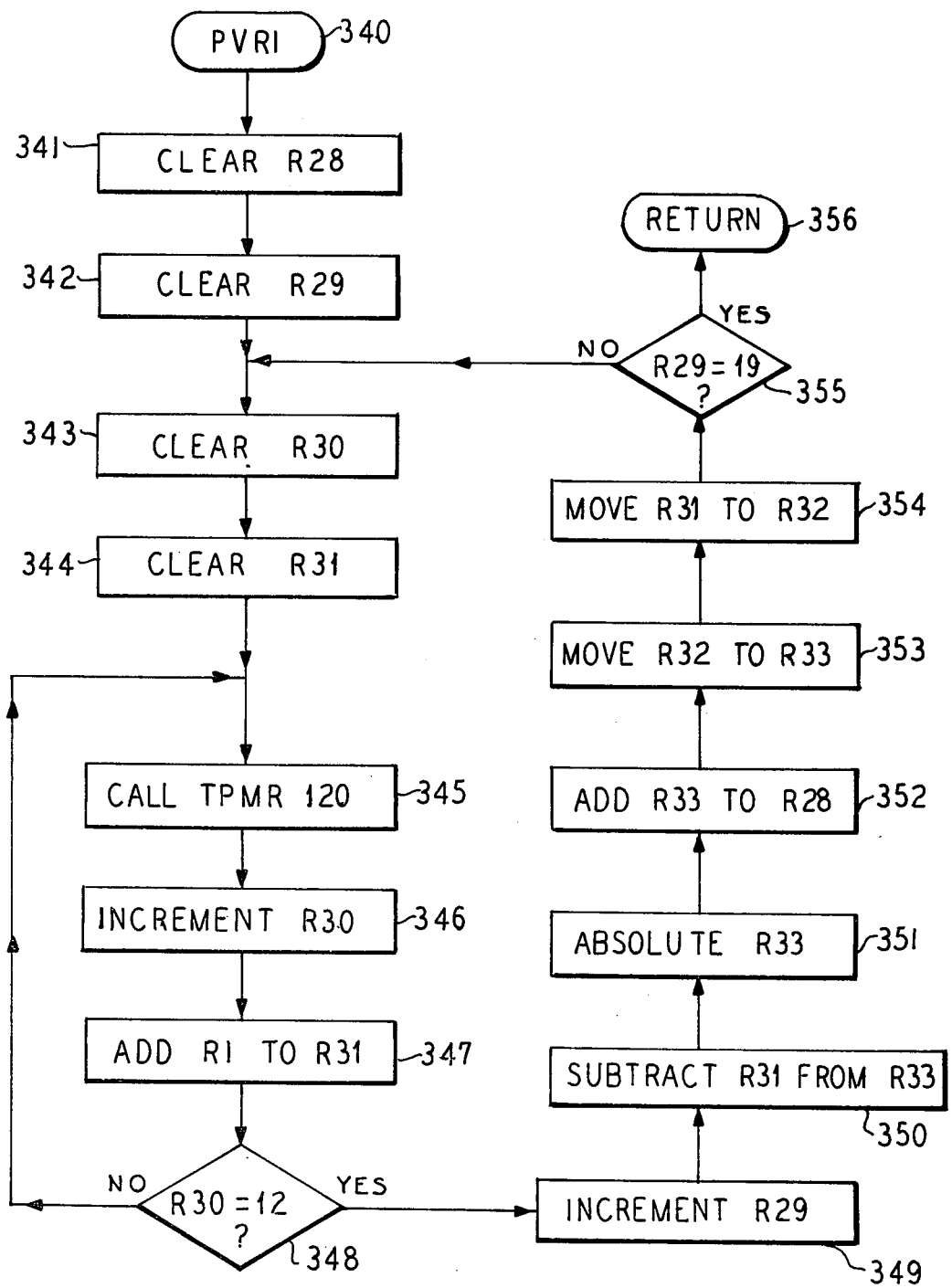
FIG. 17 is a flow chart for a basic motor phase variability routine PVR1 which preferably calls the true phase monitoring routine of FIG. 5 and is employed to compute dishwasher pump slugging numbers.

FIG. 17 is a flowchart for a basic motor phase variability routine 340 which preferably calls the true phase monitoring routine 120 and is employed to compute a number called the dishwasher pump slugging number approximately every two seconds during the filling or draining of chamber 2012 in dishwasher 2010 of FIG. 15a. The pump slugging number is a measure of the variability of the returned true phase numbers for a precise sample period. The routine 340 requires exactly 228 half cycles or slightly under two seconds to run. The routine 340 is called repeatedly by preferred supervisory dishwasher end-of-drain and automatic water level control routines.

The motor 10 phase variability routine 340 begins at step 341 by clearing a register R28 in which the pump slugging number or motor phase variability number will be accumulated. At step 342 the comparison count register R29 is cleared. A half cycle count register R30 and a phase number sum register R31 are cleared respectively at steps 343 and 344. Steps 345 through 348 define a program loop which sums a block or sequence of twelve consecutive phase pulse numbers at the sum register R31. Specifically, the true phase monitoring routine 120 is called at step 345. The half cycle count register R30 is incremented at step 346. At step 347 the last phase number at register R1 is added to the sum at register R31. Decision step 348 causes the program to branch back to step 345 if the half cycle count register R30 is not equal to 12. When register R30 is equal to 12, the program falls through decision step 348 to step 349.

The rest of routine 340 compares the most recent block sum of 12 consecutive true phase numbers to the third most recent block sum and accumulates the grand sum of the absolute value of the difference of 19 consecutive block sum comparisons at register R28. Specifically, at step 349 the comparison count register R29 is incremented. At step 350 the last block sum of 12 consecutive true phase numbers at register R31 is subtracted from the third to last block sum at register R33 with the difference number stored at register R31. At this point the difference number at register R33 may be positive, negative or zero. At step 351 the absolute value of the number in register R33 is placed in register R33. At step 352 the positive difference number at register R33 is added to the grand total pump slugging number at register R28. Steps 353 and 354 adjust the memory stack of previous block sums. At step 353 the previous second to last block sum becomes the new third to last block sum by moving register R32 to register R33. At step 154 the previous last or most recent block sum becomes the new second to last block sum by moving register R31 to register R32.

Decision step 355 causes the program to branch back to step 343 until 19 block comparisons have been made. When the comparison count register R29 is 19, the program falls through decision step 355 to return 356 to the calling program in dishwasher control 2025. Memory stack registers R32 and R33 retain data for when the routine 340 is called again beginning with the next half cycle. The grand total pump slugging number is in register R28. The first returned pump slugging number at register R28 during each dishwasher fill and drain period is useless because data registers R32 and R33 may start with old or undefined data. The routine 340 is typically called repeatedly throughout a procedure such as filling or draining the dishwasher 2010. When this is done the returned pump slugging numbers at register R28 are all good beginning with the second time the routine 340 is called. Data utilization in this manner facilitates more rapid response to a smooth running pump condition than if two extra blocks of 12 phase numbers were required each time the routine 340 is called. The memory stack height, the data block size and number of block comparisons in the exemplary embodiment have been experimentally determined to provide optimal performance consistent with the use of minimal microcomputer 50 data memory. Other phase variability parameters would also provide satisfactory performance and are included in the broad scope of the present invention.

Figure 18:
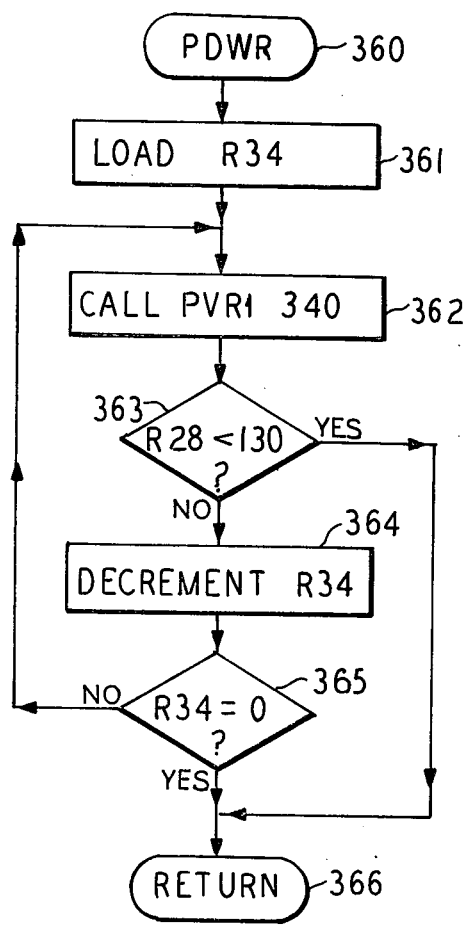
FIG. 18 is a flow chart for a preferred dishwasher supervisory automatic water level routine PDWR which calls the motor phase variability routine of FIG. 17 and is employed to terminate the water fill when sufficient water is in the system to allow the pump to run smoothly.

FIG. 18 is a flowchart for a preferred dishwasher supervisory automatic water level control routine 360 which repeatedly calls the motor phase variability routine 340 and is employed to determine when there is sufficient water in the dishwashing system to allow the pump means 2017 to run smooth. The calling program in control 2025 turns the dishwasher motor 10 and water fill solenoid controlling valve 2016 ON a few seconds before routine 360 is called. The preferred dishwasher automatic water level control routine 360 begins at step 361 by loading a loop count register R34 with a preset number which defines the maximum fill time. In the exemplary embodiment register R34 is loaded with 55 at step 361. This also defines a preset maximum fill volume when an appropriate flow restrictor washer is used at the water inlet valve 2016.

The dishwasher phase variability routine 340 is called at step 362. Decision step 363 terminates the program by jumping to step 366 if the returned motor phase variability or pump slugging number at register R28 is less than 130. Otherwise, the program falls through decision step 363 to step 364. The loop count register R34 is decremented at step 364. Decision step 365 causes the program to branch back to step 362 if the loop count register R34 is not zero. Otherwise, the program is terminated on a time basis if the loop count register R34 has been decremented to zero. The calling program in control 2025 will terminate the water fill at this point. The phase variability routine 340 requires exactly 228 half cycles to execute. Insufficient water in the dishwasher pump means 2017 causes mechanical load variations or pulsations at the pump means which cause simultaneous perturbations in the motor 10 mechanical loading and returned motor phase numbers at register R1. The appropriate amount of water varies with each unit due to pump and motor variations and at each installation due to variations in line voltage, dish loading and surface area, and with detergent and/or food type concentration. The routine 360 provides automatic compensation of the water fill for each of the variables with no factory or field adjustment required.

Figure 19:
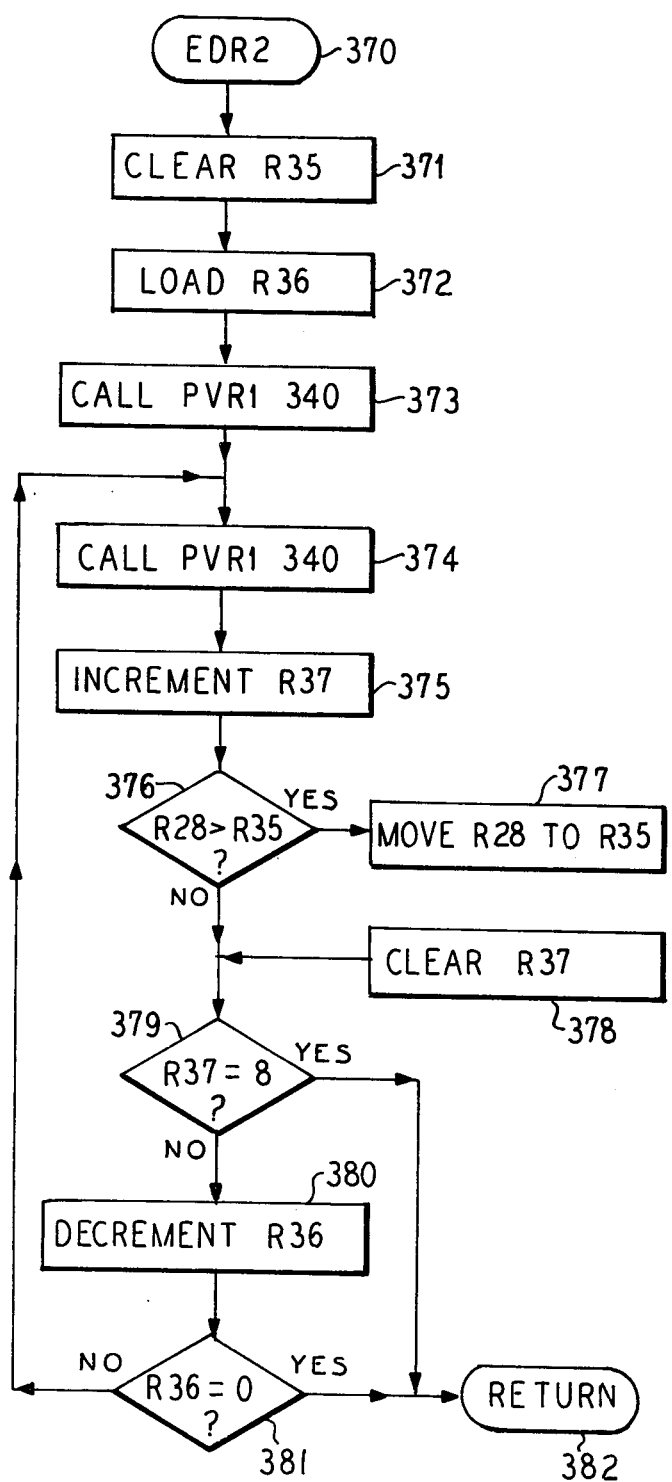
FIG. 19 is a flow chart for a preferred dishwasher supervisory end-of-drain routine EDR2 which calls the motor phase variability routine of FIG. 17 and is employed to define a fixed add-on-time from the transition point when the drain water flow rate subsides from full flow to a pulsating flow.

FIG. 19 is a flowchart for a preferred dishwasher supervisory end-of-drain routine 370 which repeatedly calls the motor phase variability routine 340 and is employed to define a fixed add-on time from the transition point when the drain water flow rate subsides from full flow to a pulsating flow. The routine 370 achieves programming economy by using the same dishwasher motor phase variability routine 340 as the above fill routine 360. After the control 2025 has reversed the direction of rotation of motor 10 to provide a flow of washing liquid from the chamber 2012 to the drain for ten seconds to establish a full drain flow rate, the routine 370 is called. The end-of-drain routine 370 begins at step 371 by clearing a maximum pump slugging number at register R35. A loop count register R36 is loaded at step 372. Register R36 is used to define a maximum drain time. For the exemplary embodiment register R36 is loaded with 34. The motor phase variability routine 340 is called at step 373. The routine 340 returns with current data in memory stack registers R32 and R33. The routine 370 is not terminated until 8 consecutive pump slugging numbers have been found which do not set a new maximum at register R35.

More specifically, the phase variability routine 340 is called at step 374. A count register R37 is incremented at step 375. Decision step 376 causes the program to go to step 377 if the last returned pump slugging number at register R28 is greater than the maximum pump slugging number at register R35. The program always goes to step 377 on the first pass because register R35 is cleared at step 371. The last pump slugging number at register R28 is moved to register R35 at step 377. The count register R37 is cleared at step 378. After performing step 378 the program goes to decision step 379. Otherwise, the program falls through decision step 376 to decision step 379. Decision step 379 terminates the routine 370 by jumping to step 382 if register R37 is equal to 8. Thus the routine 370 is terminated if no new maximum pump slugging number is found on eight consecutive passes through decision step 376. Otherwise, the program falls through decision step 379 to step 380. The loop count register R36 is decremented at step 380. Decision step 381 defines a preset maximum drain time by causing the program to return at step 382 to the calling program if register R36 has been decremented to zero. Otherwise, the program branches back to step 374. The dishwasher drain portion of the dishwashing cycle is terminated upon the return at step 382 by the calling program in control 2025.

Figure 20:
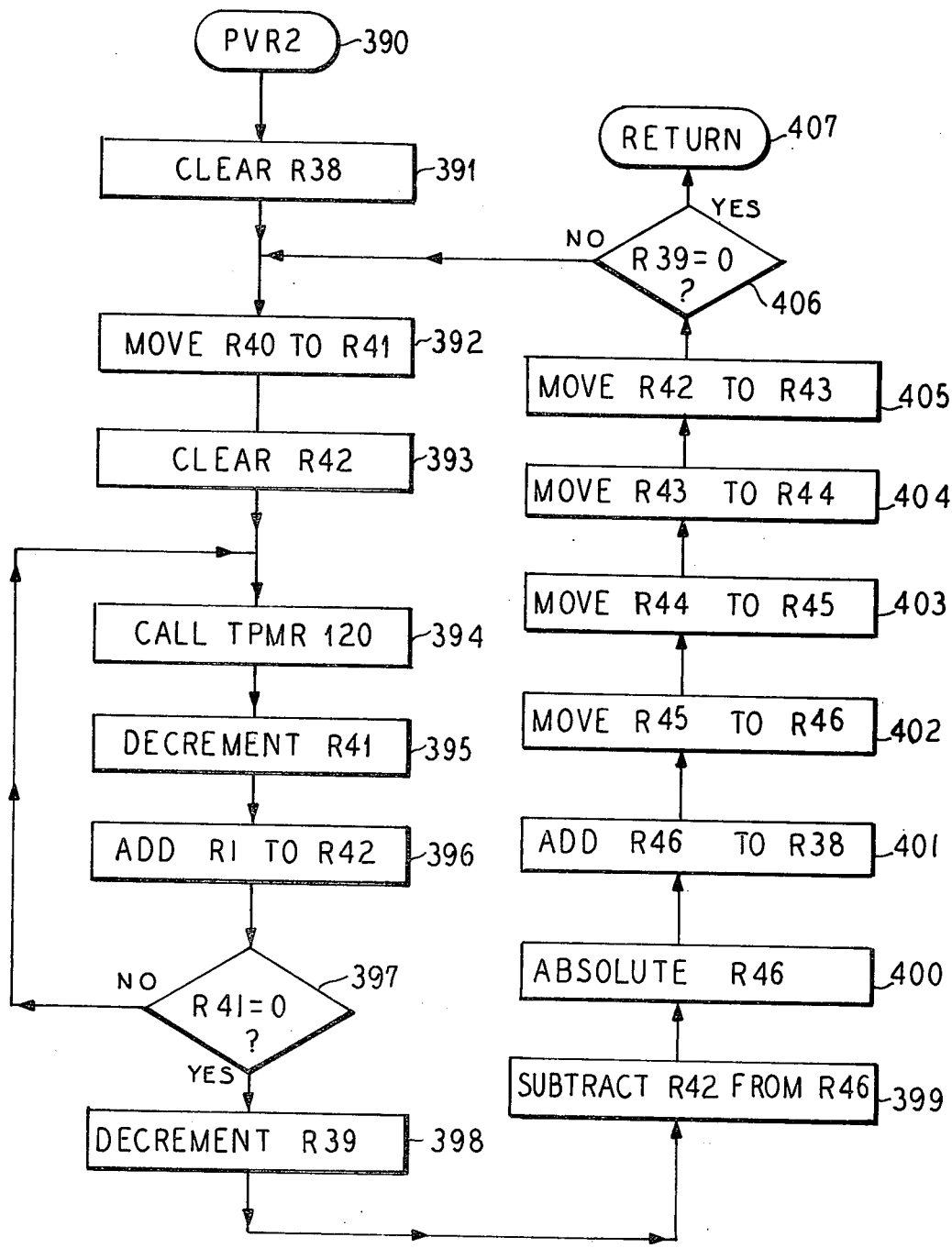
FIG. 20 is a flow chart for a motor phase variability routine PVR2 which is a modification of the basic routine of FIG. 18 and is employed to compute clothes tumble numbers for appliances with a revolving drum such as a clothes dryer and a horizontal-axis clothes washer.

FIG. 20 is a flowchart for a motor phase variability routine 390 which is a modification of routine 340 and is employed to compute a number which is sensitive to variations in motor loading due to minute differences in the clothes tumble pattern from one drum revolution to the next drum revolution on appliances with a revolving drum such as the clothes dryer of FIG. 14a or a front loading horizontal-axis clothes washer. The routine 390 is structured to eliminate the effects of any consistent rotational variations in drum friction on the motor loading. The routine 390 advantageously uses a memory stack of five registers and requires the calling supervisory programs to preset the length of the consecutive true phase number block at a register R40 and the number of block sum comparisons at a register R39. Each data block is the sum of the true phase number data for one-fourth of a drum revolution, and the memory register stack is used to compare each most recent data block sum to data acquired when the drum was in the same position on the most previous revolution. This procedure cancels out any rotational variations in the dryer drum friction and emphasizes motor phase variability due to any difference in the way the clothes load is tumbling from one drum revolution to the next revolution. The final clothes tumble number is the grand sum of a preset number of block sum comparisons with four comparisons per drum revolution.

The motor phase variability routine 390 begins at step 391 by clearing the register R38 in which the clothes tumble number or motor phase variability number is accumulated. As will be described in FIGS. 21 and 22, the routine 390 includes two registers R39 and R40 which must be appropriately loaded by the calling program before the routine 390 is called. Register R39 is loaded with the number of block sum comparisons such as 300, and register R40 is loaded with the number of half cycle true phase number data points per block sum such as 37. For the above example numbers of 300 and 37, the routine 390 will execute in exactly 300×37 or 11,100 half cycles, or approximately 75 (300 divided by 4) complete drum revolutions. The block half cycle count number at register R40 is moved to a register R41 at step 392 without affecting the number at register R40. A phase number sum register R42 is cleared at step 393. Steps 394 through 397 define a program loop which sums a block or sequence of consecutive true phase numbers at the sum register R42. Specifically, the true phase monitoring routine 120 is called at step 394. The half cycle count register R41 is decremented at step 395. At step 396 the last phase number at register R1 is added to the sum at register R42. Decision step 397 causes the program to branch back to step 394 if the half cycle count register R41 is not zero. When register R41 has been decremented to zero, the program falls through decision step 397 to step 398.

The rest of routine 390 compares the most recent block sum of consecutive true phase numbers to the fifth most recent block sum and accumulates the grand sum of the absolute value of the differences of a preset number of consecutive block sum comparisons at register R38. Specifically, at step 398 the comparison count number R39 is decremented. At step 399 the last block sum of consecutive true phase numbers at register R42 is subtracted from the fifth to last block sum at a register R46 with the difference numbers stored at register R46. At this point the difference number at register R46 may be positive, negative or zero. At step 400 the absolute value of the number in register R46 is placed in register R46. At step 401 the positive difference number at register R46 is added to the grand total clothes tumble number at register R38. Steps 402, 403, 404 and 405 adjust the memory stack of previous block sums. At step 402 the previous fourth to last block sum becomes the new fifth to last block sum by moving register R45 to register R46. At step 403 the previous third to last block sum becomes the new fourth to last block sum by moving register R44 to register R45. At step 404 the previous second to last block sum becomes the new third to last block sum by moving register R43 to register R44. At step 405 the previous last or most recent block sum becomes the new second to last block sum by moving register R42 to register R43.

Decision step 406 causes the program to branch back to step 392 until the preset number of block comparisons have been made. When the comparison count number at register R39 is decremented to zero, the program falls through decision step 406 to return at step 407 to the calling program in control 1016. Memory stack registers R43, R44, R45 and R46 retain data for when the routine 390 is called again beginning with the next half cycle. The grand total clothes tumble number is in register R38. The first returned clothes tumble number at register R38 is useless because the data in memory stack registers R43, R44, R45 and R46 are undefined. The routine 390 is typically called repeatedly throughout a procedure such as determining when the dryer clothes are dry or providing automatic water level control for a horizontal-axis clothes washer. Data utilization in this manner facilitates faster response than if four extra blocks of true phase numbers were acquired to load the memory register stack each time the routine 390 is called.

Figure 21:
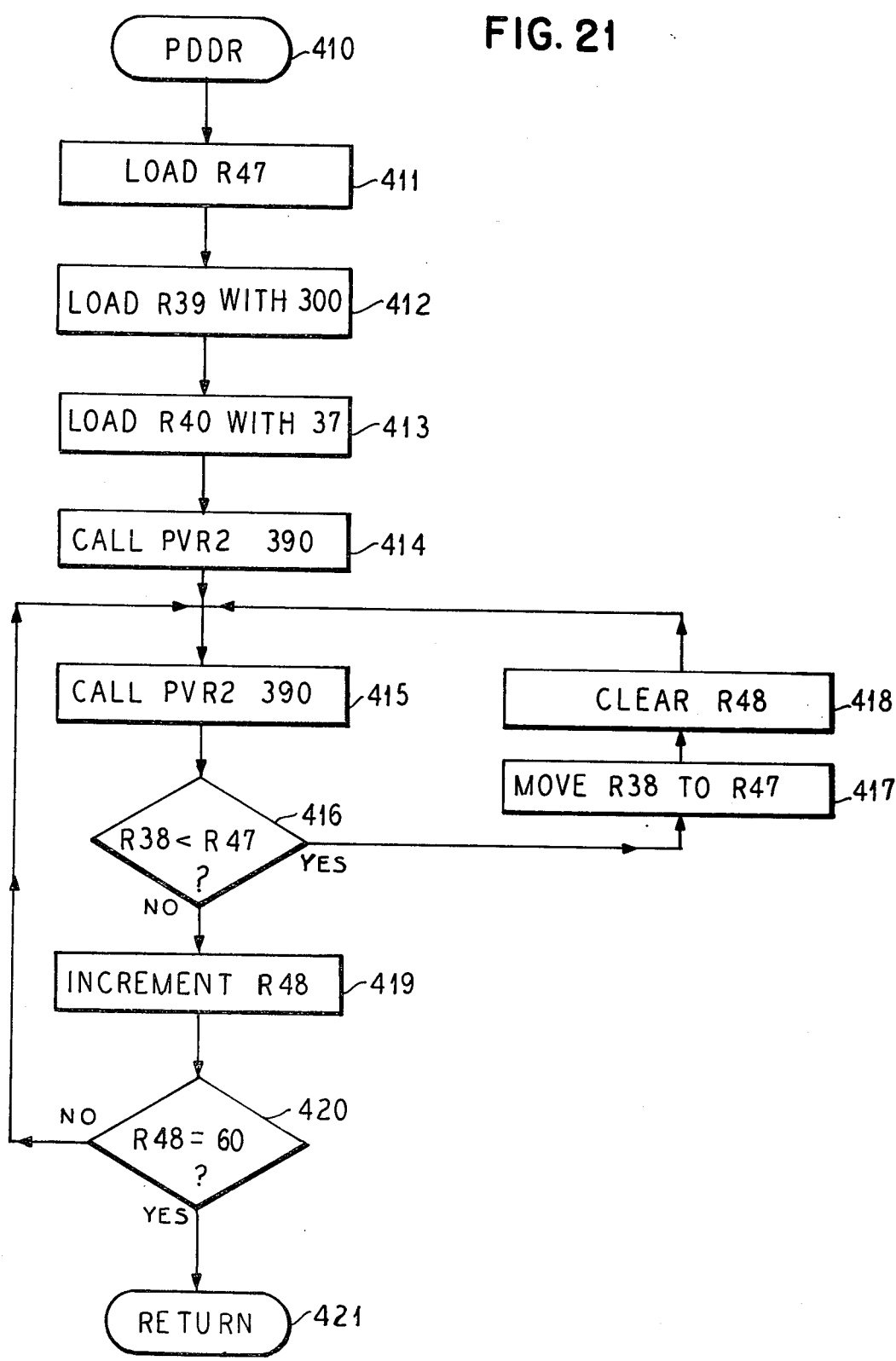
FIG. 21 is a flow chart for a preferred supervisory clothes dryer dryness sensing routine PDDR which calls the modified motor phase variability routine of FIG. 20 and is employed to detect when the clothes tumble numbers are no longer decreasing and the clothes are dry.

FIG. 21 is a flowchart for a preferred supervisory dryer clothes dryness sensing routine 410 utilized with the dryer 1010 of FIG. 14a which calls the modified motor phase variability routine 390 and is employed to detect when the returned clothes tumble numbers at register R38 are no longer decreasing and the clothes are dry. Routine 410 is similar to the supervisory dryer dryness routine 280 which uses the returned average motor torque numbers at register R18 to determine when the clothes are dry. Clothes tumble numbers are more sensitive to the condition of the clothes load, and hence routine 410 is preferred. The routine 410 begins at step 411 by loading a register R47 with a very high number. Register R47 is used to store the minimum returned clothes tumble number throughout the dry cycle. The motor phase variability routine 390 comparison count register R39 is loaded with 300 at step 412. The routine 390 block half cycle count register R40 is loaded with 37 at step 413. The exemplary dryer 1010 requires about 37 half cycles to complete one-quarter of a drum revolution. The motor phase variability routine 390 is called at step 414 to load the memory stack registers R43, R44, R45 and R46 with current data.

The motor phase variability routine 390 is called again at step 415. Decision step 416 causes the program to go to step 417 if the last returned clothes tumble number at register R38 is less than the previous minimum clothes tumble number at register R47. The program always goes to step 417 on the first pass because a very high number is initially loaded in register R47 at step 411. The last clothes tumble number at register R38 is moved to register R47 at step 417. A count register R48 is cleared at step 418. After performing step 418 the program branches back to step 415. Otherwise, the program falls through decision step 416 to step 419. The count register R48 is incremented at step 419. Decision step 420 causes the program to branch back to step 415 if register R48 is not equal to six. When the motor phase variability routine 390 has not returned a new minimum clothes tumble number at register R38 on six consecutive passes through decision step 416, the program falls through decision step 420 to return 421 to the calling program. The dry cycle may be terminated by the calling program in control 1016 after an appropriate cool down period.

Figure 22:
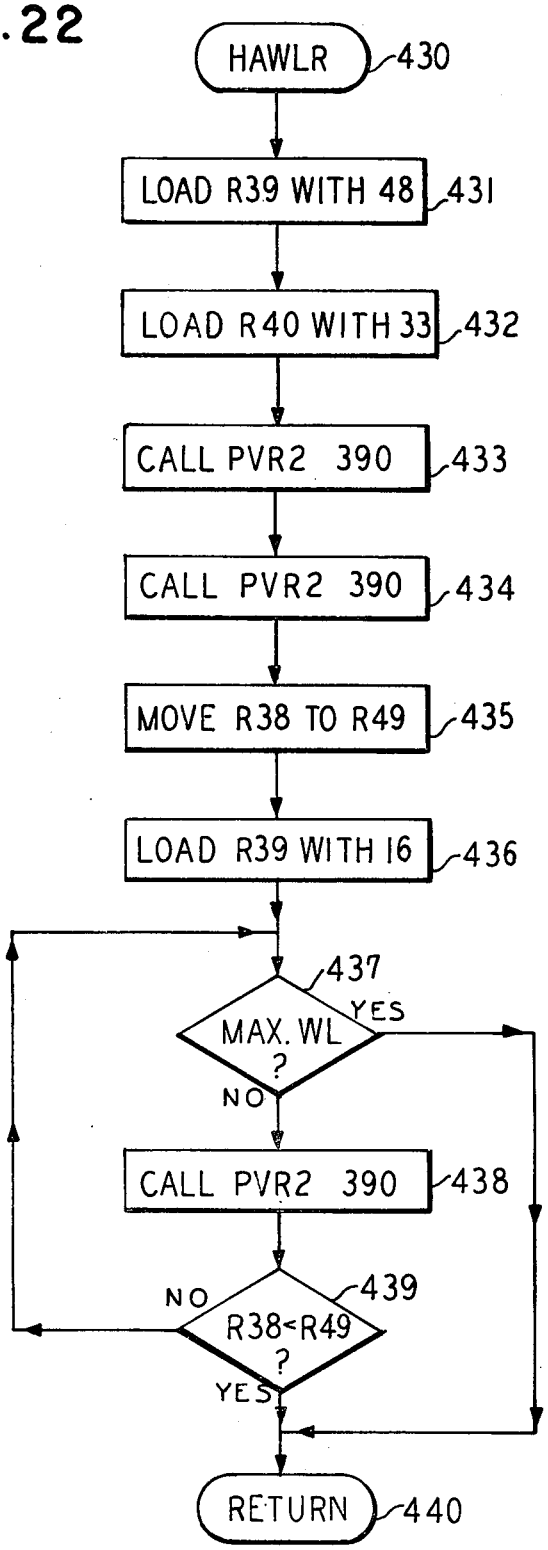
FIG. 22 is a flow chart for a supervisory horizontal-axis clothes washer automatic water level routine HAWLR which calls the modified motor phase variability routine of FIG. 20 and is employed to terminate the water fill when a clothes tumble number has exceeded a level determined by an automatic referencing procedure at the beginning of the fill.

In a front-loading horizontal-axis clothes washer, a drum for tumbling the clothes similar to dryer drum 1034 is driven by a motor 10. Hot and cold water valves similar to solenoid valve 90a of FIG. 9a are utilized to control the entry of washing liquid into the tumbling drum. FIG. 22 is a flowchart for utilization in such a front-loading horizontal-axis clothes washer as a supervisory automatic water level routine 430. Routine 430 calls the modified motor phase variability routine 390 and is employed to terminate the water fill when a clothes tumble number has exceeded a level determined by an automatic referencing technique at the beginning of the fill procedure. A control similar to control 91 of FIG. 9a includes a main program which turns the motor and the appropriate hot and/or cold water solenoids ON and tumbles the clothes for a few seconds before the routine 430 is called by the main program. Little or no standing water is in the wash chamber during the first portion of routine 430. The routine 430 begins at step 431 by loading the motor phase variability routine 390 comparison count register R39 with 48. The routine 390 block half cycle count register R40 is loaded with 33 at step 432. The exemplary horizontal-axis clothes washer requires about 33 half cycles to complete one-quarter of a drum revolution. The motor phase variability routine 390 is called at step 433 to load the memory stack registers R43, R44, R45 and R46 with current data. The motor phase variability routine 390 is called again at step 434. This time the routine 390 returns with a reliable clothes tumble number at register R38. The clothes tumble number data at register R38 is moved to register R49 for storage. The comparison count register R39 is loaded with 16 at step 436. This reduces the number of comparisons and the execution time of the routine 390 by a factor of four. The clothes tumble number in register R49 is the threshold number for terminating the water fill. The fill will not terminate until either the standing water level in the wash chamber has reached a preset maximum water level as determined by a factory preset pressure switch binary input to the microcomputer 50 or a clothes tumble number is returned at register R38 which is in excess of the threshold number obtained at step 434. Changing the comparison count at register R39 does not affect the validity of the numbers currently stored in memory stack registers R43, R44, R45 and R46.

Decision step 437 causes the routine 430 to terminate at step 440 if the maximum water level has been reached. Otherwise, the program falls through decision step 437 to step 438. The motor phase variability routine 390 is called at step 438. Decision step 439 causes the program to branch back to decision step 437 if the returned clothes tumble number at register R38 is less than the threshold number obtained by the earlier automatic referencing procedure at register R49. Otherwise, the program falls through decision step 439 and returns at step 440 to the calling program. The main program terminates the water fill at this point.

Although some portions of the above described apparatus and method of operating a motor controlled device employing an accurate motor output torque monitoring means have been explained in the context of automatic laundering dishwashing, drying and heating-/cooling appliances, the method and apparatus have utility in controlling the operation of any type of motor driven device and have utility as well in other domestic appliances such as trash compactors and refrigerator/freezers wherein differences in the load torque placed on the drive motor for such devices can trigger the occurrence of selected events in a programmed operational sequence.

Although modifications and changes may be suggested by those skilled in the art it is the intention of the inventor to embody within the patent warranted hereon all changes and modifications as reasonably and properly come within the scope of my contribution to the art.

The embodiments of the invention in which an exclusive property or privilege is claimed are defined as follows:

1. An apparatus for monitoring an output torque of an AC motor supplied with a voltage at a level and an alternating current and having a run winding and for controlling the operational sequence of a device operated by said motor, said apparatus comprising:
    an electronic means for generating a signal upon each occurrence of a current polarity change in said run winding;
    a voltage zero detector circuit for generating a series of first pulses each having a duration determined by the level of voltage supplied to said motor;
    a logic circuit connected to said electronic means and to said voltage zero detector circuit for generating a series of second pulses each having a duration from a leading edge of one of said voltage pulses to a current polarity change immediately following said leading edge;
    a processing means for manipulating said first pulses and said second pulses to generate various phase angle numbers representing the output torque of said motor; and
    a control means for controlling said device by initiating and concluding selected operations within said operational sequence dependent on said phase angle numbers.

2. The apparatus of claim 1 wherein said electronic means comprises a continuous ferrite core transformer having a primary winding including at least one turn of said run winding, and a secondary winding at which said signal is generated, said secondary winding connected to said logic circuit.

3. The apparatus of claim 2 wherein said AC motor has a true phase angle and said processing means includes program means for generating a phase pulse number representative of said true phase angle.

4. The apparatus of claim 2 wherein said processing means includes program means for generating a phase pulse number representative of a voltage compensated phase angle of said motor.

5. The apparatus of claim 1 wherein said logic circuit is comprised of:
    an OR means connected to said electronic means for receiving said signal therefrom; and a set-reset flip-flop having a set input connected to an output of said voltage zero detector circuit and a reset input connected to an output of said OR means.

6. The apparatus of claim 5 wherein said OR means consists of a first comparator having a non-inverting input connected to a reference voltage source and an inverting input connected to said electronic means, and a second comparator having a non-inverting input connected to said electronic means and a grounded inverting input, said first and second comparators having a common output connected to said reference voltage.

7. The apparatus of claim 1 further comprising a voltage regulator circuit for regulating said voltage level for generating an operating voltage for said zero detector circuit and for said logic circuit and for said processing means.

8. The apparatus of claim 1 wherein said processing means is a microcomputer.

9. The apparatus of claim 1 wherein said motor further includes a start winding, and wherein said processing means further utilizes said second pulses and a fractional portion of said first pulses for generating a series of phase angle numbers representing periodic measurements of the phase angle of said run winding of said motor during motor startup, and wherein said control means comprises a means for deenergizing said start winding when said phase angle number falls below a selected phase angle value.

10. The apparatus of claim 9 wherein said processing means includes a first program for manipulating said first and second pulses to generate said series of phase angle numbers and a second program for determining when said phase angle number falls below said selected phase angle value.

11. The apparatus of claim 1 wherein said motor further includes a start winding and wherein said processing means further utilizes said second pulses for generating a series of voltage compensated phase angle numbers representing periodic measurements of the phase angle of said run winding of said motor during motor startup, and wherein said control means comprises a means for de-energizing said start winding and a means for de-energizing said run winding if said phase angle numbers equal a selected phase angle number for a specified period of time.

12. The apparatus of claim 11 wherein said specified period of time is determined by a selected number of half cycles of the AC voltage for said motor.

13. The apparatus of claim 11 wherein said means for de-energizing said start winding and said means for de-energizing said run winding are each comprised of a TRIAC and a means for triggering said TRIAC operated by said processing means.

14. In an appliance having electrically operated devices including a driving motor which produces a torque and which is supplied by an AC voltage at a given level and an alternating current, said motor having a run winding, and control means for operating said devices at selected times, said control means comprising:

a continuous core transformer for detecting current polarity change in said motor and having a primary winding including at least one turn of said run winding and a secondary winding, said transformer generating an electrical signal at said secondary winding upon detection of said polarity change;

a voltage zero detector circuit for generating a series of first pulses which are inversely related to the given level of AC voltage supplied to said motor;

a logic circuit connected to said ferrite core transformer secondary winding and to said voltage zero detector circuit for generating a series of second pulses spaced in time from said first pulses and respectively dependent on the time spacing between a beginning of one of said first pulses and a current polarity change immediately following said leading edge;

a processing means for utilizing said first and second pulses for generating a phase number which is inversely proportional to the torque produced by said motor at a point in time, said processing means further comprising means manipulating said phase number to generate a control signal; and an operating means for utilizing said control signal for controlling timing of the electrical operating of at least one of said electrically operated devices.

15. The control means of claim 14 wherein said processing means comprises program means for generating a true phase number.

16. The control means of claim 15 wherein said appliance comprises a dishwasher.

17. The control means of claim 15 wherein said appliance comprises a clothes dryer.

18. The control means of claim 15 wherein said appliance comprises a vertical axis automatic washer.

19. The control means of claim 15 wherein said appliance comprises a horizontal-axis automatic washer.

20. The control means of claim 14 wherein said logic circuit is comprised of:

an OR means connected to said secondary winding of said core transformer for receiving said electrical signal therefrom; and a set-reset flip-flop having a set input connected to an output of said voltage zero detector circuit and a reset input connected to an output of said OR means.

21. The control means of claim 20 wherein said OR means consists of a first comparator having a non-inverting input connected to a reference voltage source and an inverting input connected to said secondary of said ferrite core transformer, and a second comparator having a non-inverting input connected to said secondary of said core transformer and a grounded inverted input, said first and second comparators having a common output connected to said reference voltage.

22. The control means of claim 14 further comprising a voltage regulator circuit for regulating said voltage level for generating an operating voltage for said zero detector circuit and for said logic circuit and for said processing means.

23. The control means of claim 14 wherein said processing means is a microcomputer.

24. The control means of claim 14 wherein said motor further includes a start winding, and wherein said means manipulating said phase number utilizes said first pulses and said second pulses for generating a series of phase numbers representing periodic measurements of the phase angle of said run winding of said motor during motor startup, and wherein said processing means generates said control signal when said phase number falls below a selected phase angle threshold value, said operating means de-energizing said start winding upon the generation of said control signal.

25. The control means of claim 14 wherein said motor further includes a start winding and wherein said means manipulating said phase number utilizes said first pulses and said second pulses for generating a series of phase angle numbers representing periodic measurements of the phase angle of said run winding of said motor during motor startup, and wherein said processing means generates said control signal if said phase angle numbers equal a selected phase angle number for a specified period of time, said operating means de-energizing said start winding and said run winding upon the generation of said control signal.

26. The control means of claim 23 wherein said specified period of time is determined by a selected number of half-cycles of the AC voltage for said motor.

27. In an automatic washing machine having a controlled cycle of operation and including a tub to be filled with liquid and clothes, an agitation means for agitating the clothes, and a motor supplied with an AC voltage and current, said motor having a run winding producing an output torque for driving said agitation means, an automatic water level control comprising:
- a continuous core transformer having a primary winding including a portion of said run winding for detecting a current polarity change in said run winding and having a secondary winding at which an electrical signal is generated upon detection of said polarity change;
- a voltage zero crossover detection circuit for generating a series of voltage pulses related to the level of said AC voltage;
- a logic circuit connected to said vlotage zero crossover detection circuit and to said secondary winding for generating a series of phase pulses, each of said phase pulses lasting from a leading edge of one of said voltage pulses to a current polarity change immediately following said leading edge;
- a processing means for generating a phase number from said voltage pulses and said phase pulses related to the phase angle of said motor at a given point in time, said processing means including program means for manipulating said phase number to generate a control signal as a selected function of said phase number;
- a fill valve means for filling said tub with liquid;
- a valve means for opening and closing said fill valve means; and
- valve control means opening said valve means at a selected point in said cycle of operation and closing said valve means upon generation of said control signal.

28. The automatic washer of claim 27 wherein said agitation means is driven in oscillation through a given stroke length having a maximum and minimum torque per stroke, and wherein said program means includes means for determining a difference in said phase numbers per stroke of said agitation means related to the difference in said maximum and minimum torque, said program means generating said control signal at a given difference threshold level.

29. The automatic washer of claim 28 wherein said program means includes means for determining the numerical difference between the maximum sum of two consecutive phase numbers and the minimum sum of two consecutive phase numbers per agitation means stroke and for repeatedly summing a plurality of consecutive numerical differences each agitation stroke, said program means generating said control signal when said plural sum falls below said threshold level a given number of consecutive strokes.

30. The automatic water level control of claim 27 wherein said logic circuit is comprised of:
- an OR means connected to said secondary winding for receiving said signal therefrom; and
- a set-reset flip-flop having a set input connected to an output of said voltage zero crossover detection circuit and a reset input connected to an output of said OR means.

31. The automatic water level control of claim 30 wherein said OR means consists of a first comparator having a non-inverting input connected to a reference voltage source and an inverting input connected to said secondary winding, and a second comparator having a non-inverting input connected to said secondary winding and a grounded inverting input, said first and second comparators having a common output connected to said reference voltage.

32. The automatic water level control of claim 27 further comprising a voltage regulator circuit for regulating said voltage level for generating an operating voltage for said zero crossover detection circuit and for said logic circuit and for said processing means.

33. The automatic water level control of claim 27 wherein said processing means is a microcomputer.

34. The automatic water level control of claim 27 wherein said motor further includes a start winding, and wherein said processing means further generates a series of phase angle measurements representing periodic measurements of the phase angle of said run winding of said motor during motor startup, and wherein said automatic water level control further comprises a means for de-energizing said start winding when said phase angle measurement equals a selected phase angle value.

35. The automatic water level control of claim 27 wherein said motor further includes a start winding and wherein said processing means further generates a series of phase angle measurements representing periodic measurements of the phase angle of said run winding of said motor during motor startup, and wherein said automatic water level control further comprises a means for de-energizing said start winding and a means for de-energizing said run winding if said phase angle measurements equal a selected phase angle for a specified period of time.

36. The automatic water level control of claim 35 wherein said specified period of time is determined by a selected number of half cycles of the AC voltage for said motor.

37. The automatic water level control of claim 35 wherein said means for de-energizing said start winding and said means for de-energizing said run winding are each comprised of a TRIAC and a means for triggering said TRIAC operated by said processing means.

38. In a dishwashing appliance having a cavity for receiving dishes to be washed, a pumping means for delivering washing liquid to said cavity and to a drain, an AC drive motor supplied with a voltage at a level and an alternating current and having a run winding, said motor producing an output torque for driving said pumping means, and a control apparatus for operating said dishwasher through a cycle of operation, said apparatus comprising:
- an electronic means for generating an electrical signal upon each occurrence of a current polarity change in said run winding;

a voltage zero detector circuit for generating a series of first pulses each having a duration determined by the level of voltage supplied to said motor;

a logic circuit connected to said electronic means and to said voltage zero detector circuit for generating a series of second pulses each having a duration from a leading edge of one of said voltage pulses to a current polarity change immediately following said leading edge;

a processing means for manipulating said first pulses and said second pulses to generate various phase angle numbers representing said output torque of said motor; and control means for controlling said cycle of operation dependent on said phase angle numbers.

39. The dishwashing appliance of claim 38 wherein said electronic means comprises a continuous core transformer having a primary winding including at least one turn of said run winding, and a secondary winding at which said signal is generated, said secondary winding connected to said logic circuit.

40. The dishwashing appliance of claim 38 wherein said processing means includes:

means for repeatedly generating a true phase angle number from said first and second pulses;

means for summing a given plurality of said true phase angle numbers;

means for generating a pump slugging number including means for summing an absolute difference between given sums of said true phase angle numbers; and means for generating a control signal at a given pump slugging number threshold.

41. The dishwashing appliance of claim 40 including a water fill valve for delivering washing liquid to said cavity, and wherein said control means comprises valve control means for opening and closing said valve, said valve control means opening said valve at a given point in said cycle of operation and closing said valve upon generation of said control signal.

42. In a clothes dryer having a rotatably mounted drum for receiving clothes to be dried, an AC drive motor supplied with a voltage at a level and an alternating current and having a run winding, said motor producing an output torque for driving said drum in rotation, and a control apparatus for operating said dryer through a cycle of operation, said apparatus comprising:

an electronic means for generating an electrical signal upon each occurrence of a current polarity change in said run winding;

a voltage zero detector circuit for generating a series of first pulses each having a duration determined by said level of voltage supplied to said motor;

a logic circuit connected to said electronic means and to said voltage zero detector circuit for generating a series of second pulses each having a duration from a leading edge of one of said voltage pulses to a change immediately following said leading edge;

a processing means for manipulating said first pulses and said second pulses to generate various phase numbers representing said outut torque of said motor; and a control means for controlling said cycle of operation dependent on said phase numbers.

43. The clothes dryer of claim 42 wherein said electronic means comprises a continuous core transformer having a primary winding including at least one turn of said run winding, and a secondary winding at which said signal is generated, said secondary winding connected to said logic circuit.

44. The clothes dryer of claim 42 wherein said processing means includes:

means for repeatedly generating a true phase angle number from said first and second pulses;

means for summing a given plurality of said true phase angle numbers;

means for generating a clothes tumble number including means for summing an absolute difference between given sums of said true phase angle numbers; and means for generating a control signal at a given clothes tumble number threshold.

45. The clothes dryer of claim 44 wherein said means for summing sums true phase angle numbers over each one-quarter of a revolution of said drum, and said means for generating further includes means for comparing one-quarter revolution sum with the fifth previous one-quarter revolution sum to obtain said difference.

46. The clothes dryer of claim 45 wherein said control means includes termination means for terminating operation of said motor after receipt of said control signal.

47. In a heating/cooling heat pump appliance having an outdoor heat exchanger, a cooling means for cooling said heat exchanger, and AC drive motor supplied with a voltage at a level and an alternating current and having a run winding, said motor producing an output torque for driving said cooling means, and a control apparatus for operating said appliance in a cycle of operation, said apparatus comprising:

an electronic means for generating an electrical signal upon each occurrence of a current polarity change in said run winding;

a voltage zero detector circuit for generating a series of first pulses each having a duration determined by the level of voltage supplied to said motor;

a logic circuit connected to said electronic means and to said voltage zero detector circuit for generating a series of second pulses each having a duration from a leading edge of one of said voltage pulses to a polarity change immediately following said leading edge;

a processing means for manipulating said first pulses and said second pulses to generate various phase numbers representing said output torque of said motor; and control means for controlling said cycle of operation dependent on said phase angle numbers.

48. The heat pump appliance of claim 47 wherein said electronic means comprises a continuous core transformer having a primary winding including at least one turn of said run winding, and a secondary winding at which said signal is generated, said secondary winding connected to said logic circuit.

49. The heat pump appliance of claim 47 wherein said processing means includes:

means for repeatedly generating a voltage compensated phase number from said second pulses;

means for averaging a plurality of said voltage compensated phase numbers; and means for generating a control signal at a given threshold level of said average.

50. In an appliance apparatus having a sequence of operations comprising a sequential cycle of operation, electrically operated means including an AC motor operating said appliance apparatus, said motor supplied with an AC voltage at a level and an alternating current, said motor having a run winding including a phase angle inversely proportional to the mechanical load on said motor, said motor including ON and OFF operational states, and a control means for controlling the cycle of operation of said apparatus, said control means comprising:

an electronic means for generating an electrical signal upon each occurrence of a current polarity change in said run winding, said electronic means including a continuous core transformer having a primary winding including one turn of said run winding; and processing means for utilizing said signal to produce a digital signal dependent on said phase angle, said processing means including sequential control means monitoring said digital signal for controlling said sequential cycle of operation of said devices including the ON and OFF operational states of said motor.

51. The appliance apparatus of claim 50 wherein said processing means includes:
means for repeatedly generating a true phase angle number from said signal;
means for summing a given plurality of said true phase angle numbers;
means for generating a torque variability number including means for summing an absolute difference between given sums of said true phase angle numbers; and
means for generating a control signal at a given torque variability threshold.

52. The appliance apparatus of claim 50 wherein said processing means includes:
means for repeatedly generating a phase number from said signal;
means for summing a given plurality of said phase numbers;
means for generating a torque variability number including means for summing an absolute difference between given sums of said phase numbers; and
means for generating a control signal at a given torque variability threshold.

53. The appliance apparatus of claim 50 wherein said processing means includes:
means for repeatedly generating a voltage compensated phase number from said signal;
means for averaging a plurality of said voltage compensated phase numbers; and
means for generating a control signal at a given threshold level of said average.

54. In a horizontal axis clothes washer having a rotatably mounted drum for receiving clothes to be washed, an AC drive motor supplied with an AC voltage at a level and an alternating current, said motor having a run winding, said motor producing an output torque for driving said drum in rotation and a control apparatus for operating said washer through a cycle of operation, said apparatus comprising:

an electronic means for generating an electrical signal upon each occurrence of a current polarity change in said run winding;
a voltage zero detector circuit for generating a series of first pulses each having a duration determined by the level of voltage supplied to said motor;

a logic circuit connected to said electronic means and to said voltage zero detector circuit for generating a series of second pulses each having a duration from a leading edge of one of said voltage pulses to a current polarity change immediately following said leading edge;
a processing means for manipulating said first pulses and said second pulses to generate various phase numbers representing said output torque of said motor; and
a control means for controlling said cycle of operation dependent on said phase numbers.

55. The clothes washer of claim 54 wherein said electronic means comprises a continuous ferrite core transformer having a primary winding including at least one turn of said run winding, and a secondary winding at which said signal is generated, said secondary winding connected to said logic circuit.

56. The clothes washer of claim 54 wherein said processing means includes:
means for repeatedly generating a true phase angle number from said first and second pulses;
means for summing a given plurality of said true phase angle numbers;
means for generating a clothes tumble number including means for summing an absolute difference between given sums of said true phase angle numbers; and
means for generating a control signal at a given clothes tumble number threshold.

57. The clothes washer of claim 56 wherein said means for summing sums true phase angle numbers over each one-quarter of a revolution of said drum, and said means for generating further includes means for comparing one-quarter revolution sum with the fifth previous one-quarter revolution sum to obtain said difference.

58. A method for controlling an appliance having electrically operated devices and at least one motor-driven component, said electrically operated devices including a given level AC voltage and current supplied motor having a run winding, said motor producing an output torque for driving said component, said method comprising the steps of:
detecting each polarity change of the current in said run winding;
generating a signal upon occurrence of each said polarity change;
generating a series of voltage pulses each having a duration which is inversely proportional to the level of said AC voltage;
generating a series of phase pulses each having a duration beginning at a leading edge of one of said voltage pulses and ending at a current polarity change immediately following said leading edge;
utilizing said voltage pulses and said phase pulses for generating a phase angle number corresponding to said output torque of said motor; and
energizing and de-energizing said electrically operated devices as a selected function of said phase angle number.

59. The method of claim 58 whereinthe step of generating a signal upon the occurrence of each said polarity change is further defined by generating a series of alternating positive and negative voltage spikes upon the occurrence of each said polarity change.

60. The method of claim 59 wherein the step of generating a series of alternating positive and negative voltage spikes upon the occurrence of each said polarity change is further defined by generating said spikes with a continuous ferrite core transformer having a primary winding consisting of at least one turn of said run winding and a secondary winding in which said voltage spikes are generated.

61. The method of claim 58 wherein the step of generating a series of voltage pulses is further defined by the steps of:
fullwave rectifying said AC voltage;
comparing the fullwave rectified voltage to a selected voltage threshold level; and
generating a voltage pulse for those periods during which said fullwave rectified voltage is below said voltage threshold level.

62. The method of claim 58 wherein the step of generating a series of phase pulses is further defined by the steps of:
supplying the signals generated upon the occurrence of each polarity change to an OR means for generating an output series of pulses occurring at said polarity changes;
supplying said output pulses from said OR means to a reset input of a set-reset flip-flop; and supplying said voltage pulses to a set input of said flip-flop, whereby said flip-flop is set at the beginning of each voltage pulse and generates a pulse which is said phase pulse for a duration until reset by a next-following output pulse from said OR means.

63. The method of claim 58 comprising the further step of regulating said AC voltage for generating a DC voltage for use by a plurality of electronic elements employed for generating said series of voltage pulses and said series of phase pulses.

64. The method of claim 58 wherein a microcomputer is employed for the step of utilizing the voltage pulses and the phase pulses for generating said phase angle number.

65. The method of claim 58 wherein said motor further includes a start winding and wherein said method comprises the additional steps of:
determining the difference in duration between respective phase pulses and ½ of the voltage pulses for generating a series of true phase numbers representing periodic measurements of the phase angle of said run winding of said motor during motor startup;
comparing said series of true phase numbers to a selected phase angle threshold; and
de-energizing said start winding when said true phase number falls below said selected phase angle threshold.

66. The method of claim 58 wherein said motor further includes a start winding and wherein said method comprises the additional steps of:
generating a series of phase angle numbers from said phase pulses representing periodic measurements of the phase angle of said run winding of said motor during motor startup;
comparing said phase angle numbers to a selected phase angle number; and
de-energizing said run winding and said start winding if said phase angle numbers equal said selected phase angle number for a specified period of time.

67. The method of claim 58 wherein said appliance further includes a drive train between said motor and said motor-driven component and comprising the additional steps of:
determining a first phase angle number representing the amount of motor output torque which is expended to overcome the friction in said drive train;
determining a second phase angle number representing the amount of motor output torque which is expended to overcome the friction in said drive train plus the torque expended in driving said motor driven component; and
subtracting said first number from said second number.

68. The method of claim 67 wherein the steps of determining the amount of motor output torque which is expended are further defined by the steps of:
determining the first number at a time at which a minimum load is placed on said motor by said motor-driven component; and
determining said second number at a time at which a maximum load is placed on said motor by said motor driven component.

69. A method for controlling a water level in an automatic laundry appliance having an electrically operated means for commencing and terminating water fill to a tub in said appliance containing wash liquid and clothes, said appliance further having a motor-driven agitation means in said tub and a given level AC voltage and current supplied motor with a run winding, said motor providing an output torque for driving said agitation means, said method comprising the steps of:
electronically monitoring a polarity change of the current in said run winding and generating a signal upon each occurrence of said polarity change;
generating a series of voltage pulses each having a duration which is inversely proportional to the level of said AC voltage;
generating a series of phase pulses each having a duration beginning at the leading edge of one of said voltage pulses and ending at the next-following polarity change;
utilizing said voltage pulses and said phase pulses for generating a phase angle number corresponding to said output torque of said motor; and
de-energizing said means for commencing and terminating water fill to said tub upon attainment of a selected function of said phase angle numbers.

70. The method of claim 69 wherein the step of monitoring and generating a signal upon the occurrence of each said polarity change is further defined by generating said signal with a continuous ferrite core transformer having a primary winding consisting of at least one turn of said run winding and a secondary winding in which said signal is generated.

71. A method of controlling an appliance having a sequence of operations comprising a cycle of operation, electrically operated means including an AC motor operating said apparatus, said motor supplied with an alternating current voltage at a level and an alternating current, said motor having a run winding including a phase angle inversely proportional to a mechanical load on said motor, said motor having ON and OFF operational states, said method comprising the steps of:
detecting each polarity change of said current in said run winding;
generating a signal upon each occurrence of said polarity change;
producing a digital signal from said signal dependent on said phase angle;
monitoring said digital signal; and controlling the sequential operation of said devices including the ON and OFF operational states of said motor as a function of said monitoring of said digital signal.

72. The method of claim 71 wherein the step of producing a digital signal includes means for repeatedly generating a true phase angle number from said signal, and the step of monitoring said digital signal includes the additional steps of:
   summing a given plurality of said true phase angle numbers;
   generating a torque variability number by summing an absolute difference between given sums of said true phase angle numbers; and
   generating a control signal at a given torque variability threshold.

73. The method of claim 71 wherein said step of producing a digital signal includes means for repeatedly generating a phase angle number from said signal, and the step of monitoring said digital signal includes the additional steps of:
   summing a given plurality of said phase angle members;
   generating a torque variability number by summing an absolute difference between given sums of said phase angle numbers; and
   gerating a control signal at a given torque variability threshold.

74. A method for controlling an automatic washer having a tub to be filled with liquid and clothes, an agitation means for agitating the clothes, an AC voltage and current supplied motor having a run winding for driving said agitation means, a fill valve for filling said tub with liquid, and a controlled cycle of operation, including the steps of:
   energizing a valve control means for opening a fill valve for filling said tub with liquid;
   generating an electrical signal upon each occurrence of a current polarity change in said run winding with a continuous ferrite core transformer having a primary winding consisting of at least one turn of said run winding and a secondary winding in which said signal is generated;
   generating a phase number from said electrical signal;
   manipulating said phase number to generate a controlled signal as a selected function of said phase number; and
   de-energizing said valve control means to close said valve means upon generation of said control signal.

75. A method of controlling a dishwashing appliance having a cavity for receiving dishes to be washed, a pumping means for delivering washing liquid to said cavity and to the drain, and AC motor supplied with an alternating current voltage at a level, said motor having a run winding, said motor providing an output torque for driving said pumping means, and a control apparatus for operating said dishwasher through said cycle of operation, said method comprising:
   generating a signal upon occurrence of each polarity change in said run winding;
   generating a series of first pulses each having a duration determined by said level of voltage supplied to said motor;
   generating a series of second pulses each having a duration from a leading edge of one of said voltage pulses to the next following polarity change;
   processing said first pulses and said second pulses to generate various phase angle numbers representing the output torque of said motor; and
   controlling said cycle of operation as a function of said phase angle numbers.

76. The method of claim 75 wherein said processing step includes:
   repeatedly generating a true phase angle number from said first and second pulses;
   summing a given plurality of said true phase angle numbers;
   generating a pump slugging number including means for summing an absolute difference between given sums of said true phase angle numbers; and
   generating a control signal at a given pump slugging number threshold.

77. A method of controlling a clothes dryer having a rotatably mounted drum for receiving clothes to be dried, an AC drive motor supplied with an alternating voltage and current, said motor having a run winding providing an output torque for driving said drum in said rotation and a control apparatus for operating said dryer through a cycle of operation, said method comprising:
   generating a signal upon each occurrence of a polarity change in said run winding;
   generating a series of first pulses each having a duration determined by said level of voltage supplied to said motor;
   generating a series of second pulses each having a duration from a leading edge of one of said voltage pulses to a current polarity change immediately following said leading edge;
   processing said first pulses and said second pulses to generate various phase angle numbers representing said output torque of said motor; and
   controlling said cycle of operation as a function of said phase angle numbers.

78. The method of claim 77 wherein the step of processing is further defined by the steps of:
   repeatedly generating a true phase angle number from said first and second pulses;
   summing a given plurality of said true phase angle numbers;
   generating a clothes tumble number including means summing an absolute difference between given sums of the true phase angle numbers; and
   generating a control signal at a given clothes tumble number threshold.

79. A method of controlling a heating/cooling heat pump appliance having an outdoor heat exchanger, a cooling means for cooling said heat exchanger, an AC drive motor supplied with an alternating voltage and current, said motor having a run winding providing an output torque for driving said cooling means, and a control apparatus for operating said appliance in a cycle of operation, said method comprising:
   generating an electrical signal upon each occurrence of a current polarity change in said run winding;
   generating a series of first pulses each having a duration determined by said level of voltage supplied to said motor;
   generating a series of second pulses each having a duration from a leading edge one of said voltage pulses to a current polarity change immediately following said leading edge;
   repeatedly generating a voltage compensated phase number from said second pulses;
   averaging a plurality of voltage compensated phase numbers;
   generating a control signal at a given threshold level of said average; and
   controlling said cycle of operation upon the occurrence of the generation of said control signal.

* * * * *